United States Patent
Moon et al.

(10) Patent No.: US 11,469,288 B2
(45) Date of Patent: Oct. 11, 2022

(54) DISPLAY DEVICE

(71) Applicant: Samsung Display Co., Ltd., Yongin-si (KR)

(72) Inventors: Jong Won Moon, Cheonan-si (KR); Hyung Jun An, Cheonan-si (KR); Cheol Hwan Eom, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 305 days.

(21) Appl. No.: 16/797,605

(22) Filed: Feb. 21, 2020

(65) Prior Publication Data
US 2020/0295114 A1   Sep. 17, 2020

(30) Foreign Application Priority Data

Mar. 13, 2019   (KR) ........................ 10-2019-0028550

(51) Int. Cl.
*H01L 27/32* (2006.01)
*H05K 1/18* (2006.01)
*H05K 1/14* (2006.01)
*H05K 1/02* (2006.01)

(52) U.S. Cl.
CPC ...... *H01L 27/3276* (2013.01); *H01L 27/3223* (2013.01); *H01L 27/3244* (2013.01); *H01L 27/3272* (2013.01); *H05K 1/0259* (2013.01); *H05K 1/147* (2013.01); *H05K 1/189* (2013.01)

(58) Field of Classification Search
CPC ............. H01L 27/3276; H01L 27/3223; H01L 27/3272; H01L 27/3244; H05K 1/118; H05K 1/0268; H05K 1/147; H05K 1/0259; H05K 1/0298; H05K 1/189;
(Continued)

(56) References Cited

U.S. PATENT DOCUMENTS 9,576,865 B2 *   2/2017   Lim ........................ H01L 23/66
9,788,439 B2 *  10/2017   Takano ................ H05K 1/0298
(Continued)

FOREIGN PATENT DOCUMENTS

KR            10-1726262 B1      4/2017
KR        10-2017-0135601 A     12/2017
(Continued)

*Primary Examiner* — Dale E Page
*Assistant Examiner* — Quovaunda Jefferson
(74) *Attorney, Agent, or Firm* — Lewis Roca Rothgerber Christie LLP

(57) ABSTRACT

A display device includes: a first circuit board, wherein a first end of the first circuit board is attached to the panel pad area; and a second circuit board attached to a second end of the first circuit board, wherein the panel pad area includes a plurality of panel signal wirings, the second circuit board includes a plurality of circuit signal wirings, the first circuit board includes a first wiring layer including a plurality of first lead wirings coupled to the plurality of panel signal wirings, an insulating layer on the first wiring layer, and a second wiring layer on the insulating layer and electrically connected to the first wiring layer through the via hole, the plurality of first lead wirings includes a first sub-lead wiring, a second sub-lead wiring, and a first dummy lead wiring between the first sub-lead wiring and the second sub-lead wiring.

20 Claims, 17 Drawing Sheets

(58) Field of Classification Search
CPC .......... H05K 2201/09781; H05K 2201/10128; H05K 2201/0256; G02F 1/1345
See application file for complete search history.

(56) References Cited

U.S. PATENT DOCUMENTS 11,036,263 B2 * 6/2021 Lee ........................ G02B 1/16
2020/0295113 A1 * 9/2020 Lee ..................... G02F 1/13458

FOREIGN PATENT DOCUMENTS

| KR | 10-2018-0025392 A | 3/2018 |
|----|-------------------|--------|
| KR | 10-1900738 B1     | 9/2018 |

* cited by examiner

DISPLAY DEVICE

CROSS-REFERENCE TO RELATED APPLICATION

This application claims priority to and the benefit of Korean Patent Application No. 10-2019-0028550 filed Mar. 13, 2019 in the Korean Intellectual Property Office, the disclosure of which is incorporated herein by reference in its entirety.

BACKGROUND

1. Field

Aspects of some example embodiments of the present invention relate to a display device.

2. Description of the Related Art

A display device is a device for visually displaying data. Such a display device includes a substrate which may be divided into a display area and a non-display area. A plurality of pixels are arranged on the substrate in the display area, and a plurality of pads may be arranged on the substrate in the non-display area. The plurality of pads may be connected with a flexible film (COF film) mounted with a driving integrated circuit or the like to transmit driving signals to the pixels. Further, the flexible film may be mounted with a main circuit board for controlling the driving integrated circuit or the like.

The flexible film includes a plurality of laminated structures. The laminated structures may include a first wiring layer and a second wiring layer on the first wiring layer and connected to the first wiring layer through a via hole. The first wiring layer may be coupled with the pads, and the second wiring layer may be coupled with the pads of the main circuit board.

Meanwhile, defects of the flexible film may be inspected by inspecting the first wiring layer through the exposed inspection pads of an inspection unit, and the inspection unit is cut to expose the side surfaces of the plurality of laminated structures to the outside. In this case, external ions, moisture, and the like may penetrate the first wiring layer through the exposed surface of the first wiring layer, which may cause wiring corrosion. Due to the wiring corrosion, an electrical short of the plurality of signal lines of the first wiring layer may occur.

The above information disclosed in this Background section is only for enhancement of understanding of the background and therefore it may contain information that does not constitute prior art.

SUMMARY

According to some example embodiments of the present invention, a device may be capable of preventing or reducing instances of an electrical short of a plurality of signal lines of a first wiring layer facing a display panel of a first circuit board.

However, aspects of embodiments of the present invention are not restricted to those specifically set forth herein. The above and other aspects of the present invention will become more apparent to one of ordinary skill in the art to which the present invention pertains by referencing the detailed description of the present invention given below.

According to some example embodiments of the present disclosure, a display device includes: a display panel including a display area and a panel pad area around the display area; a first circuit board, one end of which is attached to the panel pad area; and a second circuit board attached to the other end of the first circuit board, wherein the panel pad area includes a plurality of panel signal wirings, the second circuit board includes a plurality of circuit signal wirings, the first circuit board includes a first wiring layer including a plurality of first lead wirings coupled to the plurality of panel signal wirings, an insulating layer on the first wiring layer and including a via hole, and a second wiring layer on the insulating layer and electrically connected to the first wiring layer through the via hole, the plurality of first lead wirings includes a first sub-lead wiring, a second sub-lead wiring, and a first dummy lead wiring between the first sub-lead wiring and the second sub-lead wiring, the first sub-lead wiring and the second sub-lead wiring are electrically connected to the plurality of circuit signal wirings, and the first dummy lead wiring is electrically separated from the plurality of circuit signal wirings.

According to some example embodiments, the plurality of panel signal wirings are arranged over the display area and the panel pad area, and the plurality of panel signal wirings include a first sub-signal wiring connected to the first sub-lead wiring, a second sub-signal wiring connected to the second sub-lead wiring, and a dummy signal wiring physically separated from the first dummy lead wiring.

According to some example embodiments, the second wiring layer includes a first connection wiring connected to the first lead wiring, and the firs connection wiring includes a first sub-connection wiring connected to the first sub-lead wiring, a second sub-connection wiring connected to the second sub-lead wiring, and a third sub-connection wiring connected to the first dummy lead wiring.

According to some example embodiments, the second wiring layer further includes a plurality of second lead wirings arranged between ends of the first connection wiring and the first circuit board and coupled to the circuit signal wiring, and the plurality of second lead wirings includes a third sub-lead wiring connected to the first sub-connection wiring, a fourth sub-lead wiring connected to the second sub-connection wiring, and a second dummy lead wiring physically separated from the third sub-connection wiring.

According to some example embodiments, the first circuit board further includes a driving integrated circuit on the second wiring layer, the first sub-connection wiring and the second sub-connection wiring are electrically connected to the driving integrated circuit, and the third sub-connection wiring is electrically separated from the driving integrated circuit.

According to some example embodiments, the third sub-lead wiring and the fourth sub-lead wiring are electrically connected to the driving integrated circuit, and the second dummy lead wiring is electrically separated from the driving integrated circuit.

According to some example embodiments, the first sub-lead wring is a high-potential gate wiring (VGH), and the second sub-lead wiring is a low-potential gate wiring (VGL).

According to some example embodiments, the first sub-lead wring is a high-potential voltage wiring (ELVDD), and the second sub-lead wiring is a low-potential voltage wiring (ELVSS).

According to some example embodiments, the display device further includes a panel lower sheet under the display panel, wherein the panel lower sheet includes a metal layer under the display panel and a lower insulating layer under the metal layer, and the first circuit board is bent in a direction opposite to a display surface to be under the lower insulating layer.

According to some example embodiments, the metal layer is an electrostatic blocking layer.

According to some example embodiments, the lower insulating layer includes fluorine ions or sulfur ions.

According to some example embodiments, the first circuit board further includes a first protective organic layer between the lower insulating layer and the first wiring layer and a second protective organic layer on the second wiring layer, and the first protective organic layer partially expose the upper surface of the first lead wiring.

According to some example embodiments, inner side surfaces of the first protective organic layer, the insulating layer, the second wiring layer, and the second protective organic layer are arranged in a thickness direction, and the inner side surfaces thereof are exposed.

According to some example embodiments, the display device further includes an intermodule coupling member between the first protective organic layer and the lower insulating layer to couple the panel lower sheet and the first circuit board.

According to some example embodiments, the inner side surface of the first circuit board protrudes inwardly from the inner side surface of the intermodule coupling member.

According to some example embodiments, the first wiring layer and/or the first protective organic layer includes a surface crack around the inner side surface of the intermodule coupling member in a plan view.

According to some example embodiments of the present disclosure, a display device includes: a display panel including a display area and a panel pad area around the display area; a first circuit board, one end of which is attached to the panel pad area; and a second circuit board attached to the other end of the first circuit board, wherein the panel pad area includes a plurality of panel signal wirings, the second circuit board includes a plurality of circuit signal wirings, the first circuit board includes a first wiring layer including a plurality of first lead wirings coupled to the plurality of panel signal wirings, an insulating layer on the first wiring layer and including a via hole, and a second wiring layer on the insulating layer and electrically connected to the first wiring layer through the via hole, the plurality of first lead wirings includes a high-potential lead wiring, a low-potential lead wiring, and a dummy lead wiring between the high-potential lead wiring and the low-potential lead wiring, the high-potential lead wiring receives a high-potential signal from the circuit signal wiring and transmit the high-potential signal to the panel signal wiring, the low-potential lead wiring receives a low-potential signal from the circuit signal wiring and transmit the low-potential signal to the panel signal wiring, the dummy lead wiring is electrically separated from the plurality of circuit signal wirings.

According to some example embodiments, the high-potential lead wiring is a high-potential gate wiring (VGH), and the low-potential lead wiring is a low-potential gate wiring (VGL).

According to some example embodiments, the high-potential lead wiring is a high-potential voltage wiring (ELVDD), and the high-potential lead wiring is a low-potential voltage wiring (ELVSS).

According to some example embodiments, the display device further includes a panel lower sheet under the display panel, wherein the panel lower sheet includes a metal layer under the display panel and a lower insulating layer under the metal layer, and the first circuit board is bent in a direction opposite to a display surface to be under the lower insulating layer, and the lower insulating layer includes fluorine ions or sulfur ions.

BRIEF DESCRIPTION OF THE DRAWINGS

The above and other aspects and features of some example embodiments of the present invention will become more apparent by describing in more detail aspects of some example embodiments thereof with reference to the attached drawings, in which.

DETAILED DESCRIPTION

Hereinafter, aspects of some example embodiments of the present invention will be described in more detail with reference to the attached drawings.

Figure 1:
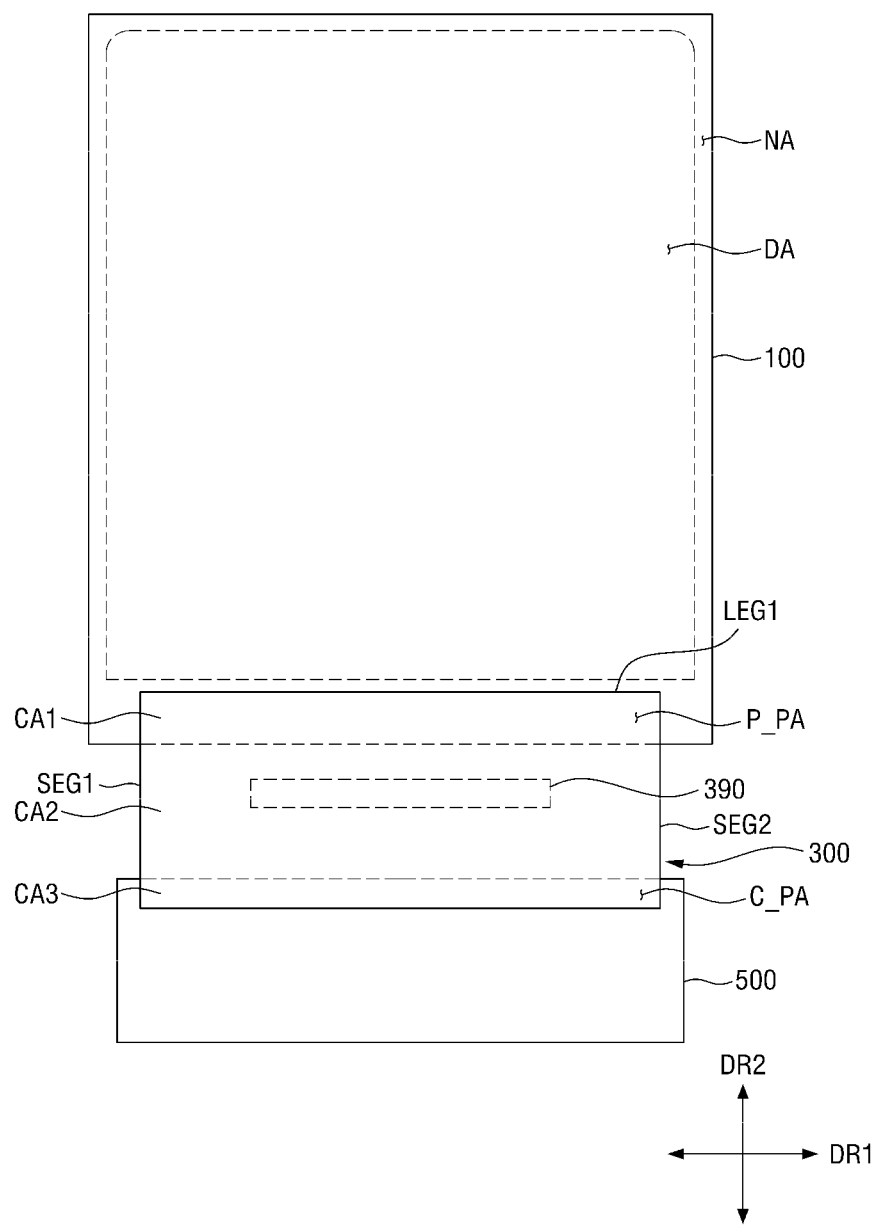
FIG. 1 is a plan layout view of a display device according to some example embodiments.
Figure 2:
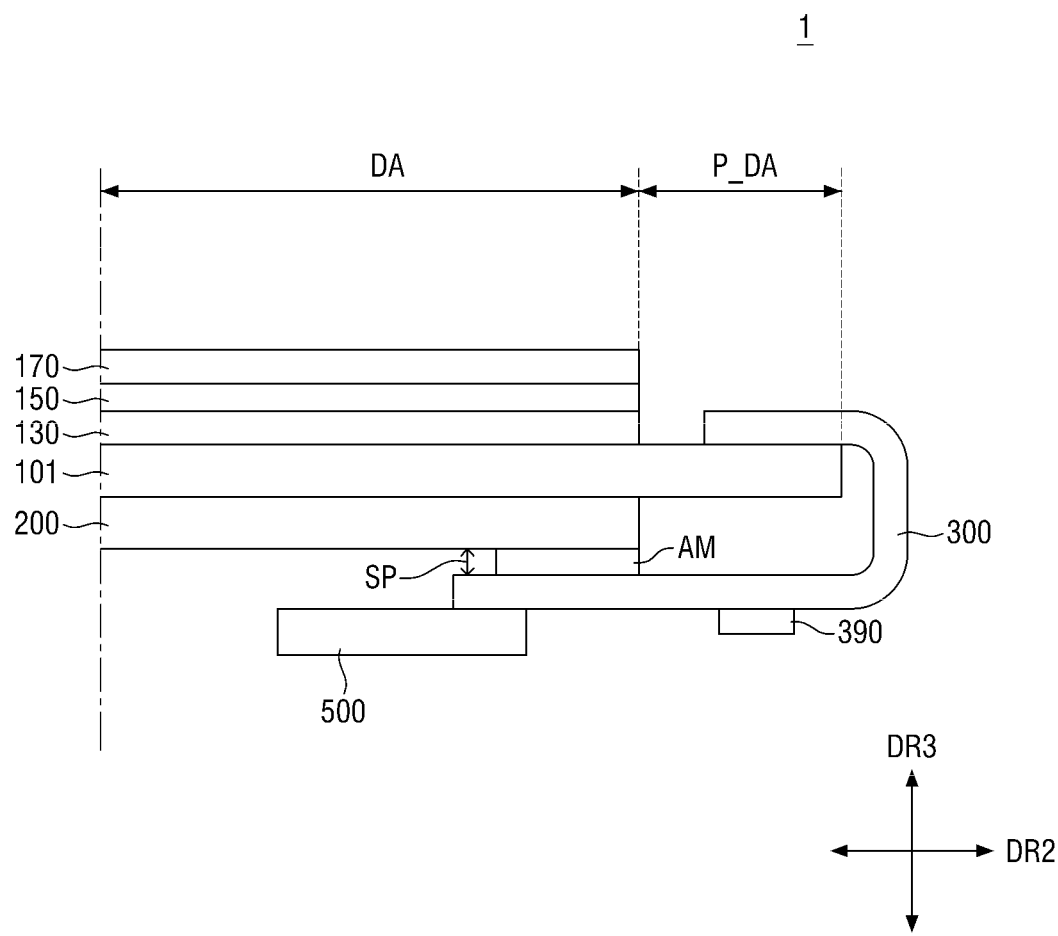
FIG. 2 is a cross-sectional view of the display device of FIG. 1.
Figure 3:
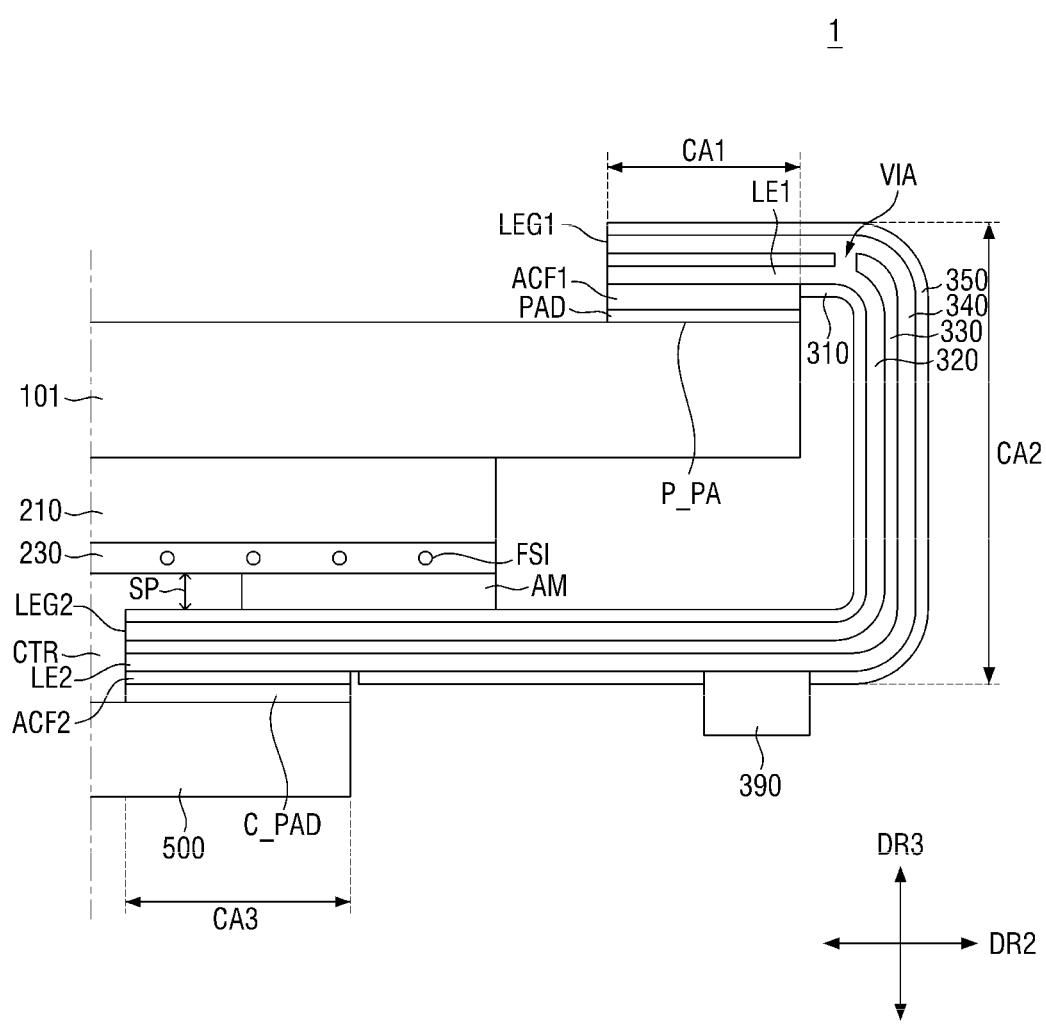
FIG. 3 is an enlarged cross-sectional view of the display device of FIG. 2.
Figure 4:
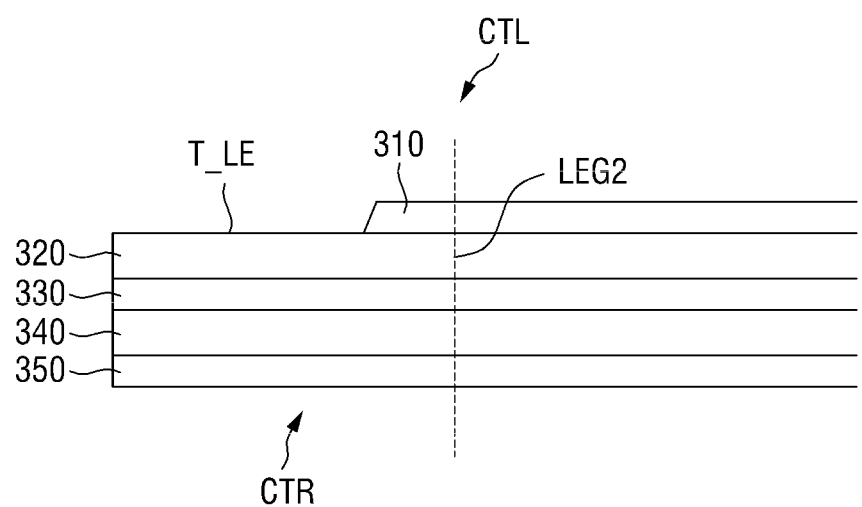
FIG. 4 is a cross-sectional view showing a cut portion provided with an inspection pad according to some example embodiments.
Figure 5:
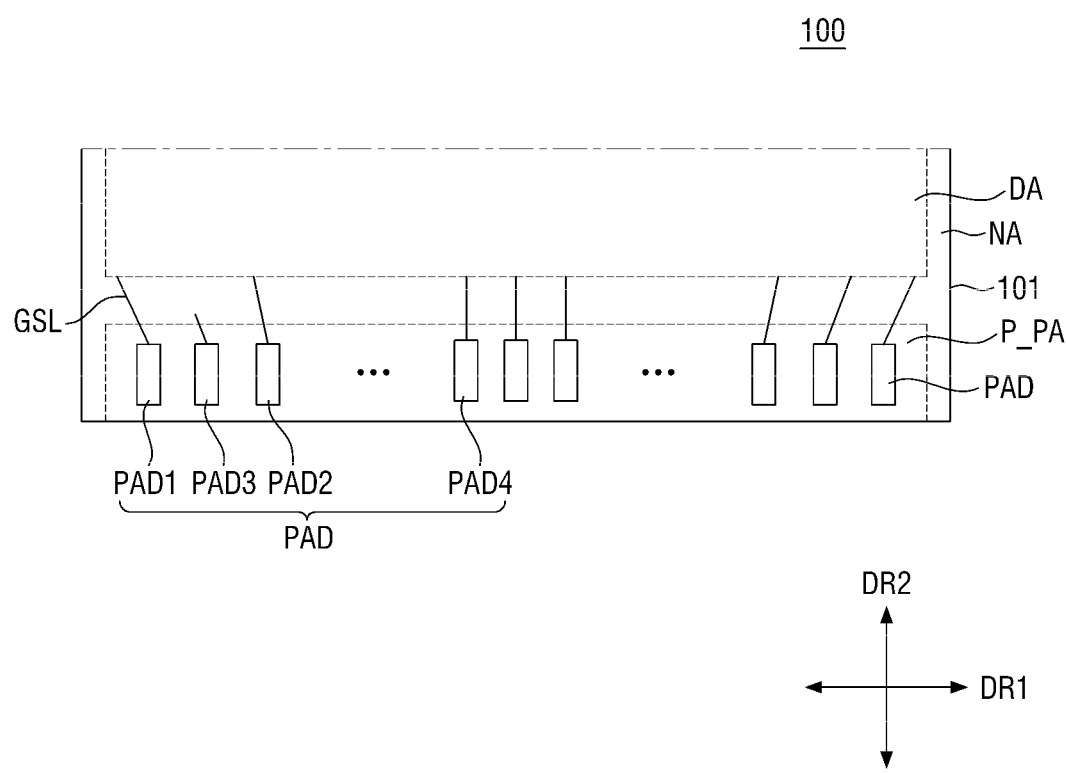
FIG. 5 is a plan layout view of a pad area according to some example embodiments.
Figure 6:
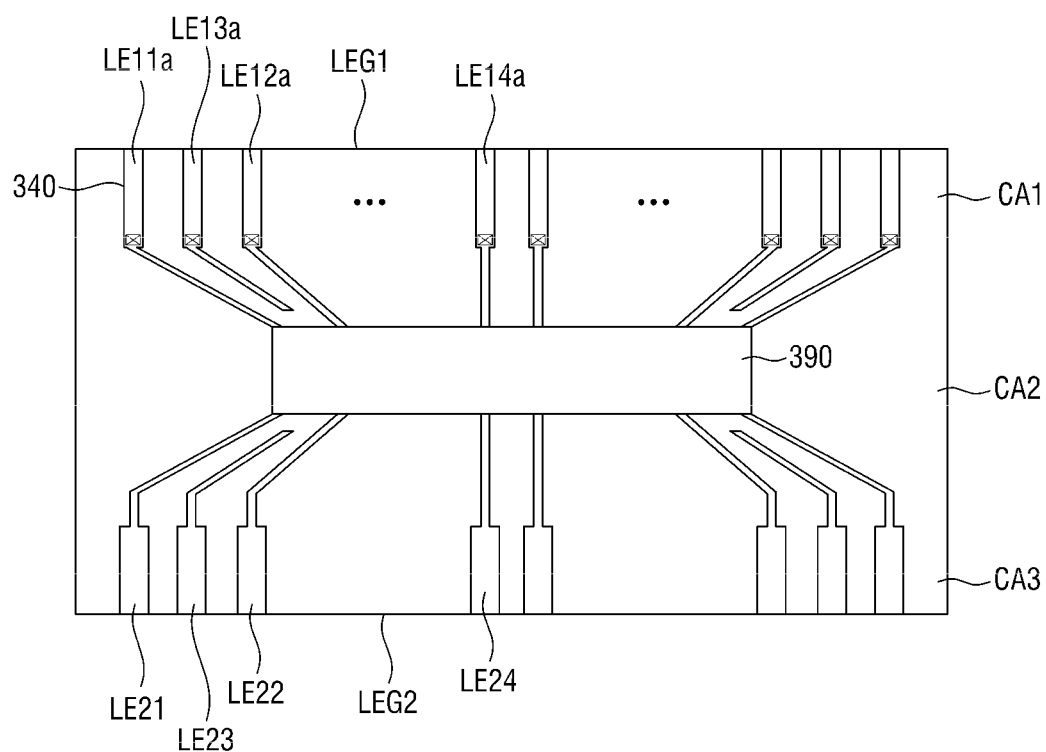
FIG. 6 is a plan layout view showing a second wiring layer of a first circuit board and a driving integrated circuit according to some example embodiments.
Figure 6:
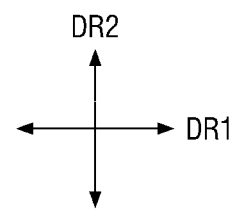
Figure 7:
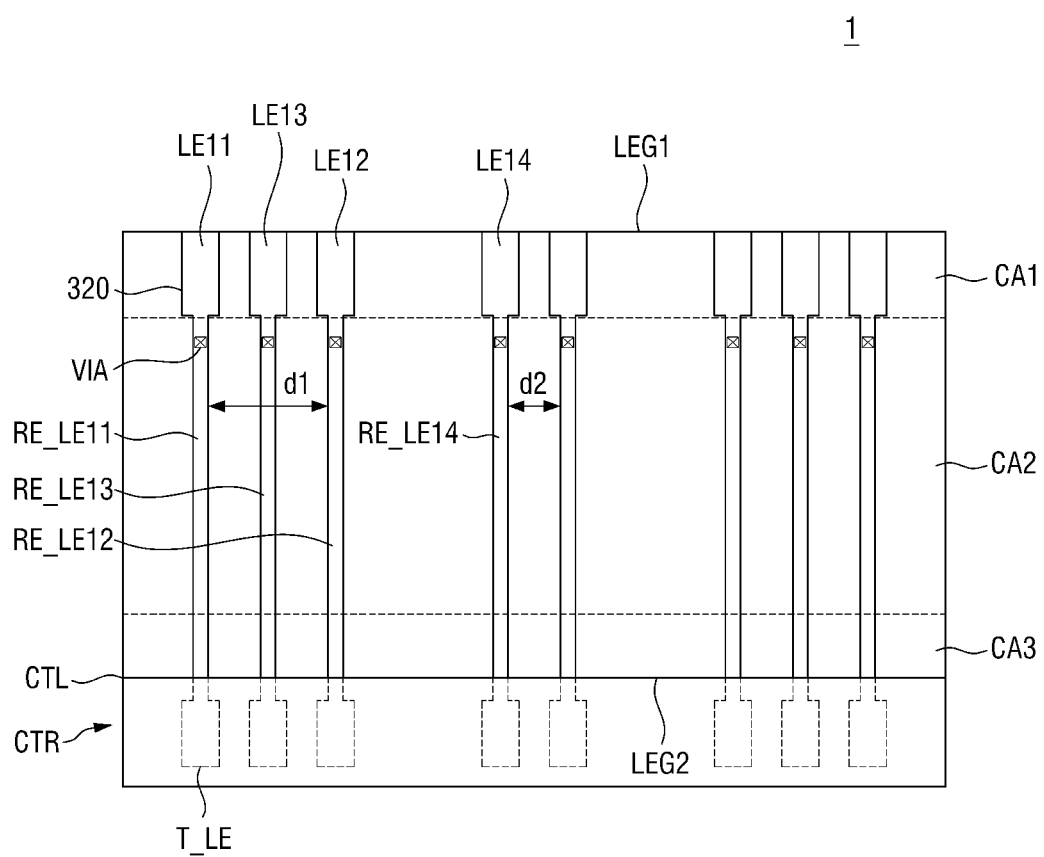
FIG. 7 is a plan layout view showing a first wiring layer of a first circuit board according to some example embodiments.
Figure 7:
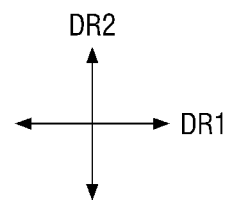

FIG. 1 is a plan layout view of a display device according to some example embodiments, FIG. 2 is a cross-sectional view of the display device of FIG. 1, FIG. 3 is an enlarged cross-sectional view of the display device of FIG. 2, FIG. 4 is a cross-sectional view showing a cut portion provided with an inspection pad, FIG. 5 is a plan layout view of a pad area, FIG. 6 is a plan layout view showing a second wiring layer of a first circuit board and a driving integrated circuit according to some example embodiments, and FIG. 7 is a plan layout view showing a first wiring layer of a first circuit board.

A display device 1, which is a device for displaying a mobile image or a still image, may be used as a display screen of various products such as televisions, notebooks, monitors, billboards, and internet of things, as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs.

Referring to FIGS. 1 to 7, the display device 1 may include a display panel 100 for displaying an image, a first circuit board 300 connected to the display panel 100, and a second circuit board 500 connected to the first circuit board 300.

As the display panel 100, for example, an organic light emitting display panel may be utilized. In the following embodiments, an example case where an organic light emitting display panel is utilized as the display panel 100 is illustrated, but embodiments of the present invention are not limited thereto, and different kinds of display panels such as a liquid crystal display panel (LCD), a quantum dot organic light emitting display panel (QD-OLED), a quantum dot liquid crystal display panel (QD-LCD), a quantum nano-emitting display panel (QNED), and a micro LED, may be utilized.

The display panel 100 includes a display area DA including a plurality of pixel areas and a non-display area NA located around the display area DA. The display area DA may have a rectangular shape having angular corners or a rectangular shape having rounded corners. The display areas DA may have short sides and long sides.

The short sides of the display area DA may be sides extending in a first direction DR1. The long sides of the display area DA may be sides extending in a second direction DR2. However, the planar shape of the display area DA is not limited to a rectangular shape, and may be a circular shape, an elliptical shape, or various other shapes. The non-display area NA may be located adjacent to both short sides and both long sides of the display area DA. In this case, the non-display areas NDA may surround all sides of the display area DA, and may constitute a frame of the display area DA. However, the present invention is not limited thereto, and the non-display area NA may be located adjacent to only both short sides or both long sides of the display area DA.

The non-display area NA of the display panel 100 further includes a panel pad area P_PA. The panel pad area P_PA may be located, for example, around one short side of the display area DA. However, the present invention is not limited thereto, and the panel pad areas P_PA may be located around both short sides of the display area DA or may be located around both short sides and both long sides of the display area DA.

The first circuit board 300 may include a plurality of laminated structures. The laminated structures may include a plurality of wiring layers, an insulating layer located between the wiring layers, and an organic protective layer located on and beneath the plurality of wiring layers. The first circuit board 300 may further include a driving integrated circuit connected to the wiring layers. Details of the laminated structures of the first circuit board 300 will be described later.

The first circuit board 300 may include a first long edge LEG1 attached to the panel pad area P_PA of the display panel 100, a second long edge LEG2 facing the first long edge LEG1 and attached to the second circuit board 500, and first and second short edges SEG1 and SEG2.

The first circuit board 300 may include a first circuit area CA1 whose one side is attached to the panel pad area P_PA of the display panel 100, a second circuit area CA2 located at one side of the first circuit area CA1 in the second direction DR2, and a third circuit area CA3 located at one side of the second circuit area CA2 in the second direction DR2 and attached to the second circuit board 500.

The second circuit board 500 may include a circuit pad area attached to the third circuit area CA3 of the first circuit board 300. A plurality of circuit pads may be arranged in the circuit pad area of the second circuit board 500 to be connected to lead wirings arranged in the third circuit area CA3 of the first circuit board 300.

Referring to FIG. 2, the display panel 100 includes a display substrate 101 located over the display area DA and the panel pad area P_PA, a circuit layer 130 located in the display area DA on the display substrate 101, a light emitting layer 150 located in the display area DA on the circuit layer 130, and an encapsulation layer 170 located in the display area DA on the light emitting layer 150. Each of the aforementioned pixel areas may include the circuit layer 130 and the light emitting layer 150.

The circuit layer 130 may include a display wiring, a display electrode, and at least one transistor, and may control the amount of light emitted from the light emitting layer 150. The light emitting layer 150 may include an organic light emitting material. The light emitting layer 150 may be sealed by the encapsulation layer 170. The encapsulation layer 170 may seal the light emitting layer 150 to prevent or reduce instances of moisture and the like being introduced into the encapsulation layer 170 from the outside. The encapsulation layer 170 may be a single-layer or multi-layer film of inorganic films or a laminated film in which inorganic films and organic films are alternately laminated.

The display device 1 further includes a panel lower sheet 200 located under the display panel 100. The panel lower sheet 200 may be attached to the back surface of the display panel 100. The panel lower sheet 200 includes at least one functional layer and a lower insulating layer. The functional layer may be a layer that performs a heat radiation function, an electromagnetic wave blocking function, a grounding function, a buffering function, a strength enhancement function, a supporting function, and/or a digitizing function. The function layer may be a sheet layer, a film layer, a thin film layer, a coating layer, a panel, or a plate. One functional layer may be formed as a single layer, but may also be formed as a plurality of laminated thin films or coating layers. The functional layer may be, for example, a supporting substrate, a heat radiation layer, an electromagnetic wave blocking layer, an impact absorbing layer, a digitizer, or the like.

The first circuit board 300 may be bent downward in a third direction DR3 as shown in FIG. 2. The other side of the first circuit board 300 and the second circuit board 500 may be located under the panel lower sheet 200.

The display device 1 may further include an intermodule coupling member AM located between the panel lower sheet 200 and the first circuit board 300. The intermodule coupling member AM may be a pressure-sensitive adhesive (PSA) member. The lower surface of the panel lower sheet 200 may be attached to the first circuit board 300 through the intermodule coupling member AM. The inner side surface of the intermodule coupling member AM may be recessed outwardly from the inner side surface of the first circuit board 300. In other words, the inner side surface of the first circuit board 300 may protrude inwardly from the inner side surface of the intermodule coupling member AM. Thus, the intermodule coupling member AM protrudes toward the inner side of the first circuit board 300 to prevent or reduce instances of foreign matter failure due to the adhesion of internal foreign matter and prevent or reduce instances of the intermodule coupling member AM falling down to the side surface of the first circuit board 300.

The portions of the first circuit board 300, protruding inward relative to the intermodule coupling member AM, may be spaced apart from each other with a space from the overlying panel lower sheet 200.

Referring to FIG. 3, the panel lower sheet 200 according to some example embodiments may include a lower metal layer 210 located between the display substrate 101 of the display panel 100 and the intermodule coupling member AM and a lower insulating layer 230 located between the lower metal layer 210 and the intermodule coupling member AM.

The lower metal layer 210 may be located on the lower surface of the display substrate 101. The lower metal layer 210 may be an electromagnetic wave blocking layer. For example, the lower metal layer 210 may include a metal thin film made of a metal such as copper (Cu), aluminum (Al), gold (Au), or silver (Ag). In some embodiments, the panel lower sheet 200 may further include a heat radiation layer between the lower metal layer 210 and the lower insulating layer 230. The heat radiation layer may include a material such as graphite or carbon nanotube (CNT).

The lower insulating layer 230 may be located on the lower surface of the lower metal layer 210. The lower insulating layer 230 may prevent or reduce instances of the current carrying between the plurality of wiring layers of the first circuit board 300 and the lower metal layer 210.

The lower insulating layer 230 may include at least one of a silicon compound and a metal oxide. For example, the lower insulating layer 230 may include at least one of silicon oxide, silicon nitride, silicon oxynitride, aluminum oxide, tantalum oxide, hafnium oxide, zirconium oxide, and titanium oxide. These compounds may be used alone or in combination with each other.

Meanwhile, as shown in FIG. 3, the lower insulating layer 230 may further include additive ions (FSI) for enhancing an insulating function. For example, the additive ions (FSI) may be fluorine ions (F—) or sulfur ions (S2-).

The first circuit board 300 includes a first protective organic layer 310, a first wiring layer 320 located on the first protective organic layer 310, a lead insulating layer 330 located on the first wiring layer 320, a second wiring layer 340 located on the lead insulating layer 330, and a second protective organic layer 350 located on the second wiring layer 340.

The first protective organic layer 310 may be located under the first wiring layer 320 to cover the first wiring layer 320 and protect the first wiring layer 320.

The first protective organic layer 310 may include an organic insulating material. Examples of the organic insulating material may include a polyacrylate resin, an epoxy resin, a phenolic resin, a polyamide resin, a polyimide resin, an unsaturated polyester resin, a polyphenylene resin, a polyphenylene sulfide resin, and benzocylcobutene (BCB).

The first protective organic layer 310 may be located over the second circuit area CA2 and the third circuit area CA3. The first protective organic layer 310 may expose the first wiring layer 320 in the first circuit area CA1. The exposed first wiring layer 320 may form a first lead wiring LE1. As shown in FIG. 3, a signal wiring PAD may be located on the panel pad area P_PA of the display substrate 101.

The signal wiring PAD may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The signal wiring PAD may be a single film including the above example material. However, embodiments of the present invention are not limited thereto, and the signal wiring PAD may be a laminated film.

The first wiring layer 320 exposed by the first protective organic layer 310, that is, the first lead wiring, may be coupled with the signal wiring PAD located on the panel pad area P_PA. A first conductive coupling member ACF1 may be located between the first wiring layer 320 and the signal wiring PAD. That is, the first wiring layer 320 may be electrically connected to the signal wiring PAD through the first conductive coupling member ACF1.

According to some example embodiments, the first lead wiring LE1 may be directly connected to the signal wiring PAD without the first conductive coupling member ACF1. That is, the first lead wiring LE1 may be directly connected to the upper surface of the exposed signal wiring PAD. For example, the first lead wiring LE1 may be ultrasonically bonded to the signal wiring PAD.

The first wiring layer 320 may include a metal material. The first wiring layer 320 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first wiring layer 320 may be electrically connected to the signal wiring PAD in an area exposed by the first protective organic layer 310.

The lead insulating layer 330 may be located on the first wiring layer 320. The lead insulating layer 330 may be provided therein with a via hole VIA penetrating the lead insulating layer 330. The lead insulating layer 330 may be located between the first wiring layer 320 and the second wiring layer 340 such that the first wiring layer 320 and the second wiring layer 340 are physically spaced apart from each other in an area excluding the via hole VIA.

Although it is shown in FIG. 3 that the via hole VIA is located in the second circuit area CA2, the present invention is not limited thereto, and the via hole VIA may be located in the first circuit area CA1.

The lead insulating layer 330 may include at least one of a silicon compound and a metal oxide. For example, the lead insulating layer 330 may include at least one of silicon oxide, silicon nitride, silicon oxynitride, aluminum oxide, tantalum oxide, hafnium oxide, zirconium oxide, and titanium oxide. These compounds may be used alone or in combination with each other.

The second wiring layer 340 may be located on the lead insulating layer 330. The second wiring layer 340 may be in contact with the first wiring layer 320 through the via hole VIA of the lead insulating layer 330. The second wiring layer 340 may include at least one of the above example materials of the first wiring layer 320. The constituent materials of the first wiring layer 320 and the second wiring layer 340 may be the same as each other, but the present invention is not limited thereto. The constituent materials of the first wiring layer 320 and the second wiring layer 340 may be different from each other.

The second protective organic layer 350 may be located on the second wiring layer 340. The second protective organic layer 350 may be located over the first circuit area CA1 and the second circuit area CA2. The second protective organic layer 350 may expose the second wiring layer 340 in the third circuit area CA3. The exposed second wiring layer 340 may form a second lead wiring LE2. In addition, the second protective organic layer 350 may expose the second wiring layer 340 in the second circuit area CA2, and the exposed second wiring layer 340 may be electrically connected to a driving integrated circuit 390.

The driving integrated circuit 390 may be located on the second circuit area CA2 of the second wiring layer 340. The driving integrated circuit 390 may be, for example, an integrated circuit in which a data driving integrated circuit for applying a data signal is incorporated with a scan driving integrated circuit for applying a scanning signal. The driving integrated circuit 390 may be applied as a chip on film (COF) implemented by a driving chip.

The second wiring layer 340 exposed by the second protective organic layer 350, that is, the second lead wiring LE2, may be coupled with a circuit signal wiring C_PAD located on the circuit pad area. A second conductive coupling member ACF2 may be located between the second wiring layer 340 and the circuit signal wiring C_PAD. That is, the second wiring layer 340 may be electrically coupled with the circuit signal wiring C_PAD through the second conductive coupling member ACF2.

According to some example embodiments, the second lead wiring LE2 may be directly connected to the circuit signal wiring C_PAD without the second conductive coupling member ACF2. That is, the second lead wiring LE2 may be directly connected to the upper surface of the exposed circuit signal wiring C_PAD. For example, the second lead wiring LE2 may be ultrasonically bonded to the circuit signal wiring C PAD.

Inner side surfaces including the first long edge LEG1 and second long edge LEG2 of the first circuit board 300 may be exposed. For example, the inner side surface of the first protective organic layer 310, the inner side surface of the first wiring layer 320, the inner side surface of the lead insulating layer 330, the inner side surface of the second wiring layer 340, and the inner side surface of the second protective organic layer 350, each of which includes the second long edge LEG2 of the first circuit board 300, may be exposed together.

Referring to FIG. 4, the first circuit board 300 may be formed by removing a cutting region CTR from a single circuit board along a cutting line CTL formed along the second long edge LEG2 described with reference to FIG. 3.

The cutting region CTR of the single circuit board may include a test lead wiring T_LE exposed by the first protective organic layer 310 of the first wiring layer 320 described with reference to FIG. 3. The cutting region CTR of the single circuit board may be removed after inspecting the presence or absence of an electrical signal and/or the intensity of an electrical signal through the test lead wiring T_LE of the single circuit board. Thus, as described above, the inner side surface of the first protective organic layer 310, the inner side surface of the first wiring layer 320, the inner side surface of the lead insulating layer 330, the inner side surface of the second wiring layer 340, and the inner side surface of the second protective organic layer 350, each of which includes the second long edge LEG2 of the first circuit board 300, may be exposed together.

Meanwhile, as described above, the lower insulating layer 230 further includes additive ions FSI. The additive ions FSI may be used in a deposition process of the lower insulating layer 230, and may be located in the lower insulating layer 230 after the deposition process of the lower insulating layer 230, but may be eluted to the outside of the lower insulating layer 230 through external moisture in an environment of high temperature and high humidity as described later. The additive ions FSI eluted to the outside may cause the corrosion of the wiring layers of the adjacent first circuit board 300. For example, the exposed inner side surfaces of the first wiring layer 320 of the first circuit board 300 may be corroded by the eluted additive ions FSI. Details thereof will be described later.

Referring to FIG. 5, a plurality of signal wirings PAD may be provided, and the plurality of signal wirings PAD may be arranged in the first direction DR1. The plurality of signal wirings PAD may include, for example, a high-potential wiring PAD1, a low-potential signal wiring PAD2, a panel dummy wiring PAD3 located between the high-potential wiring PAD1 and the low-potential signal wiring PAD2, and a data signal wiring PAD4. The data signal wiring PAD4 may be located at the center of the panel pad area P_PA, and the high-potential wiring PAD1, the low-potential signal wiring PAD2, the panel dummy wiring PAD3 located between the high-potential wiring PAD1 and the low-potential signal wiring PAD2 may be located at the periphery of the panel pad area P_PA. Although it is shown in FIG. 5 that the high-potential signal wiring PAD1 is located at the left side of the low-potential signal wiring PAD2 in the first direction DR1, the present invention is not limited thereto, the high-potential signal wiring PAD1 may also be located at the right side of the low-potential signal wiring PAD2 in the first direction DR1.

The high-potential signal wiring PAD1, the low-potential signal wiring PAD2, and the data signal wiring PAD4 may be electrically connected to a gate signal line GSL. That is, the high-potential signal wiring PAD1, the low-potential signal wiring PAD2, and the data signal wiring PAD4 may transmit a high-potential signal, a low-potential signal, and a data signal, received from the driving integrated circuit 390, to a transistor located in each pixel area of the display area DA through the gate signal line GSL. On the other hand, unlike the high-potential signal wiring PAD1, the low-potential signal wiring PAD2, and the data signal wiring PAD4, the panel dummy wiring PAD3 may be physically separated from the gate signal line GSL not to be electrically connected to the gate signal line GSL. The panel dummy wiring PAD3 serves to prevent or reduce instances of a short between the adjacent high-potential signal wiring PAD1 and low-potential signal wiring PAD2.

For example, the high-potential signal wiring PAD1 may be a high-potential voltage signal wiring ELVDD, and the low-potential signal wiring PAD2 may be a low-potential voltage signal wiring ELVSS.

According to some example embodiments, the high-potential signal wiring PAD1 may be a high-potential voltage gate signal wiring VGH, and the low-potential signal wiring PAD2 may be a low-potential voltage gate signal wiring VGL.

Referring to FIGS. 6 and 7, the first lead wiring LE1 of the first wiring layer 320 may include a plurality of sub-lead wirings LE11 to LE14. The fourth sub-lead wirings LE14 may be located at the center of the first circuit area CA1, and the first to third sub-lead wirings LE11 to LE13 may be located at the periphery of the first circuit area CA1. The first sub-lead wiring LE11 may be located at the left side of the second sub-lead wiring LE12 in the first direction DR1. The first dummy lead wiring LE13 may be located between the first sub-lead wiring LE11 and the second sub-lead wiring LE12. However, the present invention is not limited thereto. When the relative positions of the first signal wiring PAD1 and the second signal wiring PAD2 are changed, correspondingly, the first sub-lead wiring LE11 and the second sub-lead wiring LE12 may be configured such that the first sub-lead wiring LE11 is located at the right side of the second sub-lead wiring LE12 in the first direction DR1.

The first sub-lead wiring LE11 may be coupled to the high-potential signal wiring PAD1, the second sub-lead wiring LE12 may be coupled to the low-potential signal wiring PAD2, the first dummy lead wiring LE13 may be coupled to the panel dummy wiring PAD3, and the third sub-lead wiring LE14 may be coupled to the data signal wiring PAD4.

The plurality of sub-lead wirings LE11 to LE14 of the first wiring layer 320 may pass through the via holes VIA to form residual lead wirings RE_LE11 to RE_LE14 in the second circuit area CA2 and the third circuit area CA3. That is, the first sub-lead wiring LE11 may form the first residual lead wiring RE_LE11, the second sub-lead wiring LE12 may form the second residual lead wiring RE_LE12, the first dummy lead wiring LE13 may form the third residual lead wiring RE_LE13, and the third sub-lead wiring LE14 may form the fourth residual wiring RE_LE14.

The residual lead wirings RE_LE11 to RE_LE14 may be exposed together on the inner side surface including the second long edge LEG2 of the first circuit board 300 as shown in FIG. 7.

The first residual lead wiring RE_LE11, the second residual lead wiring RE_LE12, and the fourth residual lead wiring RE_LE14 may be electrically connected to the transistors of the pixel areas of the display area DA through the first sub-lead wiring LE11, the second sub-lead wiring LE12, and the third sub-lead wiring LE14, respectively. However, the first residual lead wiring RE_LE11, the second residual lead wiring RE_LE12, and the fourth residual lead wiring RE_LE14 may also be electrically separated from the transistors of the pixel areas, respectively, because the third residual lead wiring RE_LE13 is connected to the first dummy lead wiring LE13 and the first dummy lead wiring LE13 is connected to the panel dummy wiring PAD of the panel pad area P_PA. That is, the third residual lead wiring RE_LE13 may be a dummy wiring. The first residual lead wiring RE_LE11 may be connected to the high-potential signal wiring PAD1, the second residual lead wiring RE_LE12 may be connected to the low-potential signal wiring PAD3, and the fourth residual lead wiring RE_LE14 may be connected to the data signal wiring PAD4.

As shown in FIG. 7, the first residual lead wirings RE_LE11 and the second residual lead wirings RE_LE12 may be located to be spaced apart from each other by a first distance d1, and the adjacent fourth residual lead wirings RE_LE14 may be located to be spaced apart from each other by a second distance d2. In the display device 1 according to some example embodiments, the distance d1 between the first residual lead wirings RE_LE11 and the second residual lead wirings RE_LE12 may be greater than the distance d2 between the adjacent fourth residual lead wirings RE_LE14.

More specifically, the first residual lead wiring RE_LE11, the second residual lead wiring RE_LE12, and the fourth residual lead wiring RE_LE14 may be electrically connected to the driving integrated circuit 390 as will be described later. The first residual lead wiring RE_LE11 and the second residual lead wiring RE_LE12 may receive gate potential signals from the driving integrated circuit 390, and the fourth residual lead wiring RE_LE14 may receive data signals from the data driving integrated circuit of the driving integrated circuit 390.

That is, the first residual lead wiring RE_LE11 may receive a high-potential gate signal, the second residual lead wiring RE_LE12 may receive a low-potential gate signal, and the potential difference between the high-potential gate signal and the low-potential gate signal may be greater than the potential difference between the data signals. Thus, the possibility of short circuit between the first residual lead wiring RE_LE11 and the second residual lead wiring RE_LE12 may be greater than the possibility of short circuit between the adjacent fourth residual lead wirings RE_LE14.

However, in the case of the present embodiment, the first distance d1 between the first residual lead wiring RE_LE11 and the second residual lead wiring RE_LE12 is greater than the second distance d2 between the adjacent residual fourth lead wirings RE_LE14, thereby decreasing the possibility of short circuit between the first residual lead wiring RE_LE11 and the second residual lead wiring RE_LE12.

The second wiring layer 340 may include a plurality of sub-lead wirings LE11a to LE14a. The plurality of sub-lead wirings LE11 to LE14 may be connected to the plurality of sub-lead wirings LE11a to LE14a of the second wiring layer 340 through via holes VIA. That is, the first sub-lead wiring LE11 may be electrically connected to the fourth sub-lead wiring LE11a, the second sub-lead wiring LE12 may be electrically connected to the fifth sub-lead wiring LE12a, the first dummy lead wiring LE13 may be electrically connected to the sixth sub-lead wiring LE13a, and the third sub-lead wiring LE14 may be electrically connected to the seventh sub-lead wiring LE14a.

The plurality of sub-lead wirings LE11a to LE14a may extend toward the driving integrated circuit 390. The fourth sub-lead wiring LE11a, the fifth sub-lead wiring LE12a, and the seventh sub-lead wiring LE14a may be electrically connected to the driving integrated circuit 390, but the sixth sub-lead wiring LE13a may be physically separated from the driving integrated circuit 390 without being electrically connected thereto. That is, the sixth sub-lead wiring LE13a may be a dummy lead wiring.

The driving integrated circuit 390 may transmit the gate potential signal and the data signal to the plurality of sub-lead wirings LE11a, LE12a, and LE14a. That is, the driving integrated circuit 390 may apply the high-potential signal to the fourth sub-lead wiring LE11a, may apply the low-potential signal to the fifth sub-lead wiring LE12a, and may apply the data signal to the seventh sub-lead wiring LE14a. However, as described above, the driving integrated circuit 390 may be physically separated from the sixth sub-lead wiring LE13a not to be electrically connected thereto.

The second wiring layer 340 may further include a plurality of second lead wirings LE21 to LE24. The plurality of second lead wirings LE21 to LE24 may be coupled with the plurality of circuit signal wirings C_PAD of the second circuit board 500.

The second-first sub-lead wiring LE21 may be located at the left side of the second-second sub-lead wiring LE22 in the first direction DR1. The second dummy lead wiring LE23 may be located between the second-first sub-lead wiring LE21 and the second-second sub-lead wiring LE22. However, the present invention is not limited thereto, and the second-first sub-lead wiring LE21 may be located at the right side of the second-second sub-lead wiring LE22 in the first direction DR1.

The plurality of second lead wirings LE21 to LE24 may transmit the high-potential signal, the low-potential signal, and the data signal from the second circuit board 500 to the driving integrated circuit 390. As describe above, the driving integrated circuit 390 may apply the signals to the fourth sub-lead wire LE11a, the fifth sub-lead wire LE12a, and the seventh sub-lead wire LE14a. That is, the second-first lead wiring LE21 may receive the high-potential signal from the second circuit board 500, the second-second lead wiring LE22 may receive the low-potential signal from the second circuit board 500, and the second-fourth lead wiring LE24 may receive the data signal from the second circuit board 500.

However, since the second dummy lead wiring LE23 is not electrically connected to the driving integrated circuit 390 as shown in FIG. 6, the second dummy lead wiring LE23 may not serves as a signal transmission. The second dummy lead wiring LE23 may serve to prevent or reduce instances of a short between the second-first lead wiring LE21 and the second-second lead wiring LE22.

In some embodiments, the second-first sub-lead wiring LE21 may be directly connected to the fourth sub-lead wiring LE11a, the second-second sub-lead wiring LE22 may be directly connected to the fifth sub-lead wiring LE12a, and the second-fourth sub-lead wiring LE24 may be directly connected to the seventh sub-lead wiring LE14a. However, even in this case, the second-third sub-lead wiring LE23 may be physically separated from the sixth sub-lead wiring LE13a not to be electrically connected thereto.

Figure 8:
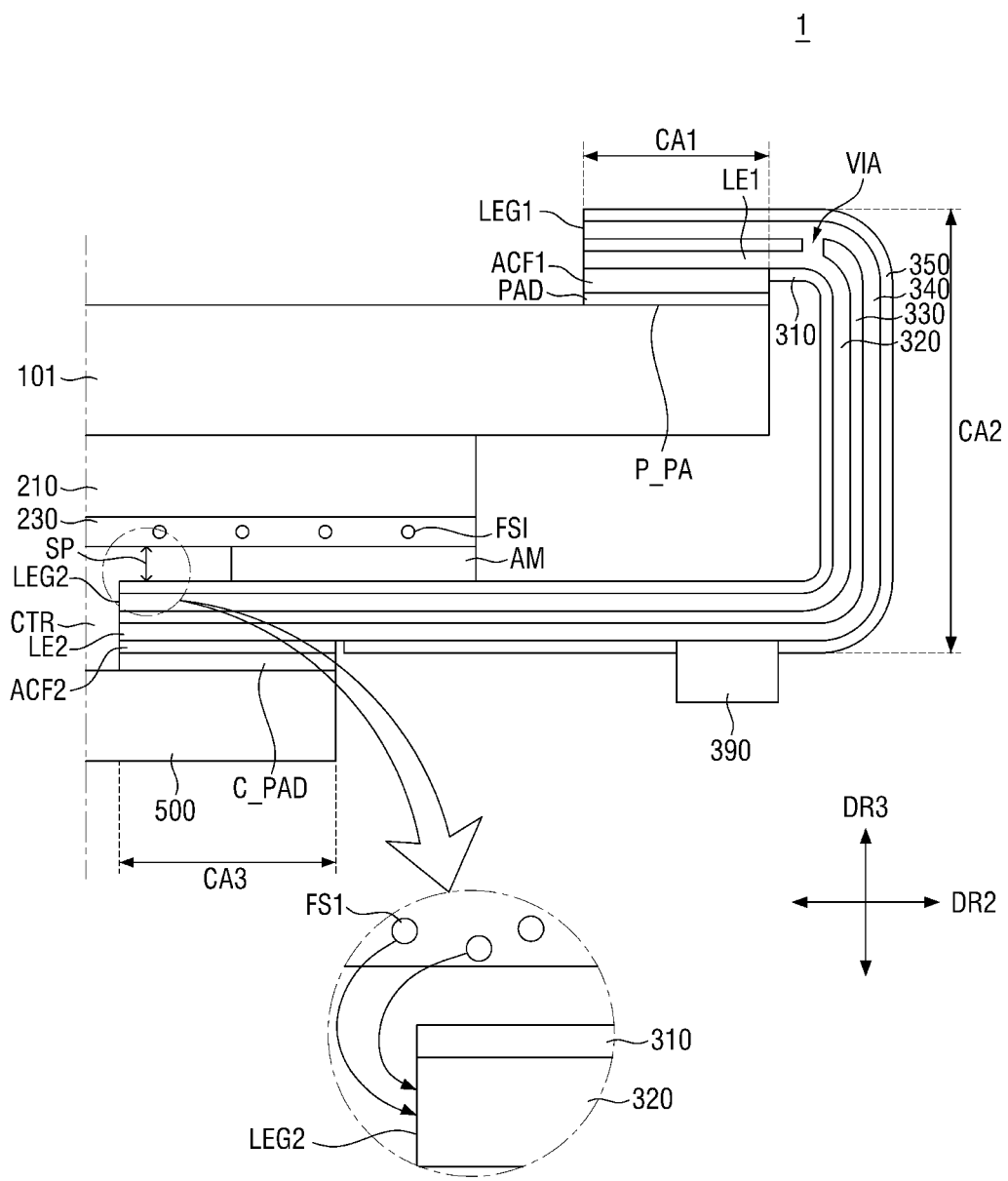
FIG. 8 is a cross-sectional view showing the penetration of additive ions into a first wiring layer through a lower insulating layer of a panel lower sheet according to some example embodiments.
Figure 9:
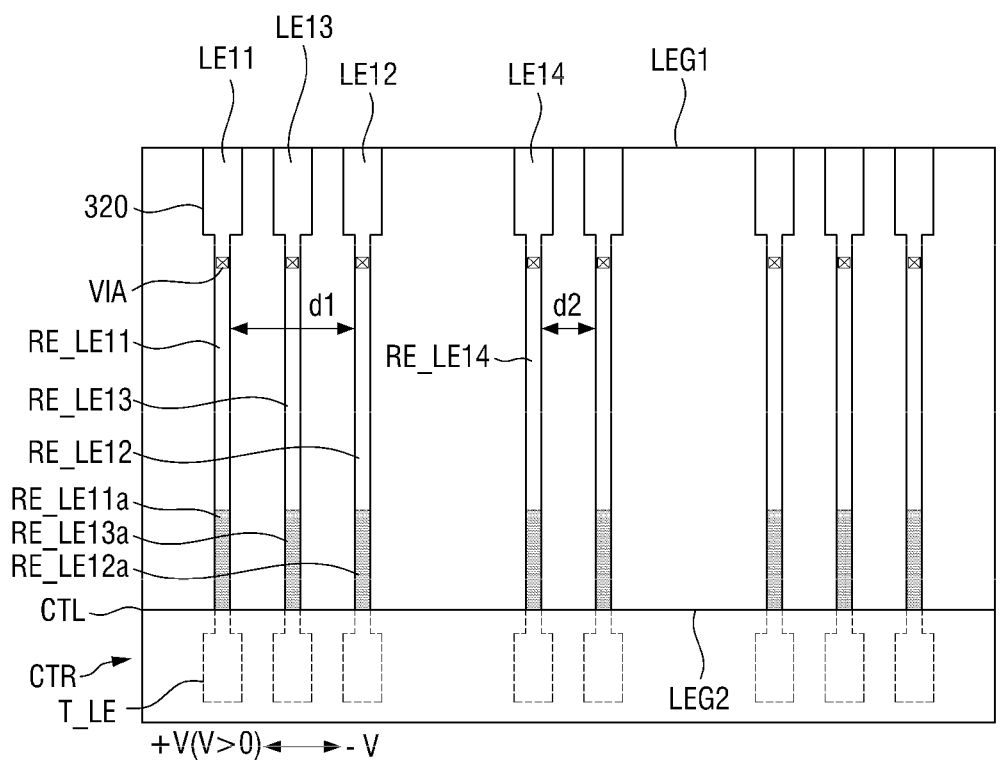
FIG. 9 is a plan view showing the corrosion of a first wiring layer of a first circuit board according to some example embodiments.
Figure 9:
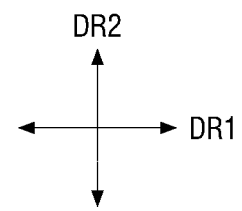
Figure 10:
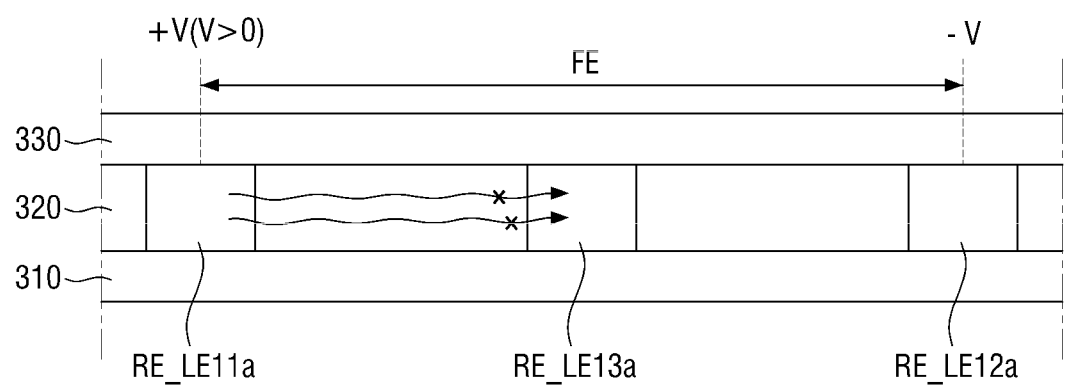
FIG. 10 is a schematic view showing a case where a dummy lead wiring of a first wiring layer prevents or reduces instances of a short between a first sub-lead wiring and a second sub-lead wring according to some example embodiments.

FIG. 8 is a cross-sectional view showing the penetration of additive ions into a first wiring layer through a lower insulating layer of a panel lower sheet, FIG. 9 is a plan view showing the corrosion of a first wiring layer of a first circuit board, and FIG. 10 is a schematic view showing a case where a dummy lead wiring of a first wiring layer prevent or reduce instances of a short between a first sub-lead wiring and a second sub-lead wring.

Referring to FIGS. 8 to 10, as described above, the lower insulating layer 230 may further include additive ions (FSI) for enhancing an insulating function. The additive ions FSI may be eluted to the outside of the lower insulating layer 230 through external moisture in an environment of high temperature and high humidity. The additive ions FSI eluted to the outside may cause the corrosion of the first wiring layer 320 of the adjacent first circuit board 300. For example, as shown in FIG. 8, the eluted additive ions FSI may penetrate into the plurality of residual lead wirings RE_LE11a to RE_LE11d of the first wiring layer 320 through the exposed inner side surface of the first wiring layer 320 of the first circuit board 300.

Accordingly, as shown in FIG. 9, the portions adjacent to the cutting line CTL of the plurality of residual lead wirings RE_LE11a to RE_LE11d may be gradually corroded.

Meanwhile, as described above, the first residual lead wiring RE_LE11a may receive the high-potential signal, and the second residual lead wiring RE_LE12a may receive the low potential signal, so that, as shown in FIGS. 9 and 10, the first residual lead wiring RE_LE11a may have a potential of +V (V>0) and the second residual lead wiring RE_LE12a may have a potential of −V (V>0). In the first residual lead wiring RE_LE11a having undergone erosion, the constituent material (ion form) of the first residual lead wiring RE_LE11a may be eluted to the outside through peripheral moisture, and may move toward the adjacent residual lead wirings due to the additive ions FSI. For example, the constituent material (ionic form) of the first residual lead wiring RE_LE11a may move toward the second residual lead wiring RE_LE12a having a potential of -V (V>0). Thus, short and/or short circuit may occur between the first residual lead wiring RE_LE11a and the second residual lead wiring RE_LE12a, thereby causing wiring failure of the display device 1.

However, in the case of the present embodiment, the third residual wiring RE_LE13, which is a dummy lead wiring having no danger of short circuit between the first residual wiring RE_LE11 and the second residual wiring RE_LE12 because a potential is not applied, is located, thereby preventing the wiring failure of the display device 1 due to the occurrence of short and/or short circuit between the first residual wiring RE_LE11a and the second residual wiring RE_LE12a. That is, the third residual wiring RE_LE13 serves as a barrier for physically preventing the movement of the constituent material (ion form) of the first residual wiring RE_LE11a toward the second residual wiring RE_LE12a having a potential of −V (V>0), thereby preventing the wiring failure of the display device 1 due to the occurrence of short and/or short circuit between the first residual wiring RE_LE11a and the second residual wiring RE_LE12a.

Hereinafter, display devices according to other embodiments will be described. In the following embodiments, the same components as those in the aforementioned embodiments will be referred to as the same reference numerals, and a description thereof will be omitted or simplified.

Figure 11:
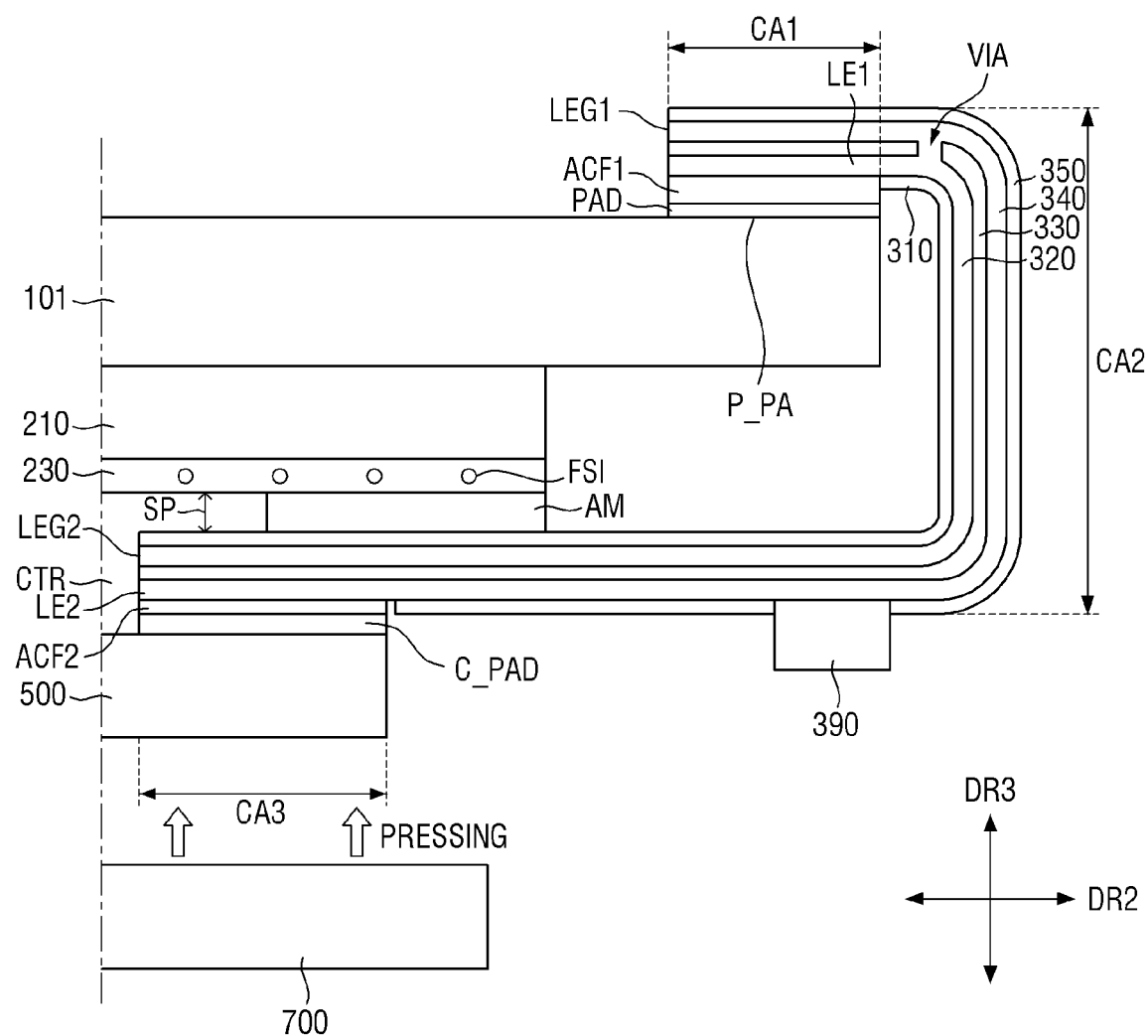
FIG. 11 is a cross-sectional view showing a case where a pressing device is under first and second circuit boards to press a lower adhesive layer according to some example embodiments.
Figure 12:
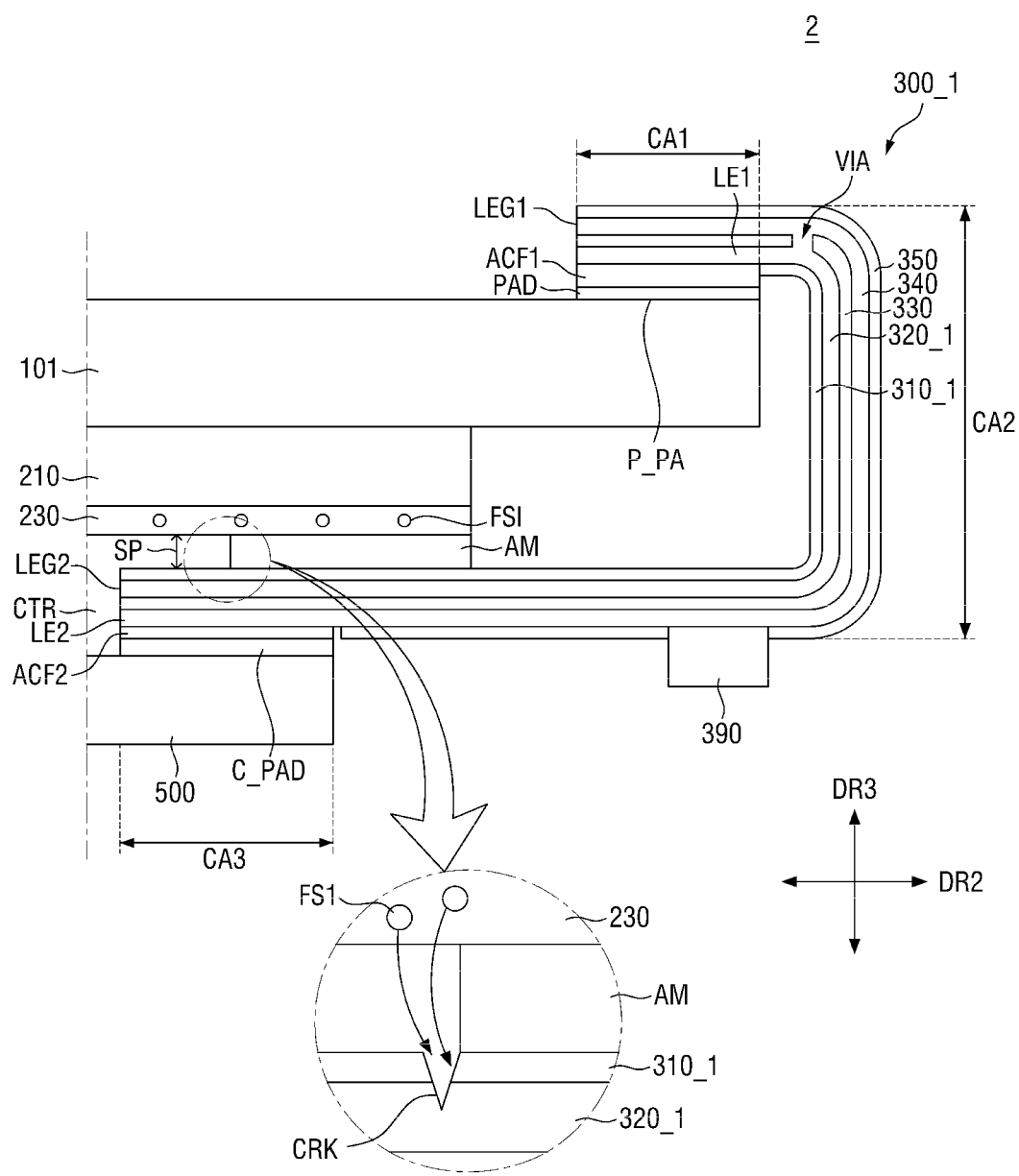
FIG. 12 is a cross-sectional view of a display device according to some example embodiments.
Figure 13:
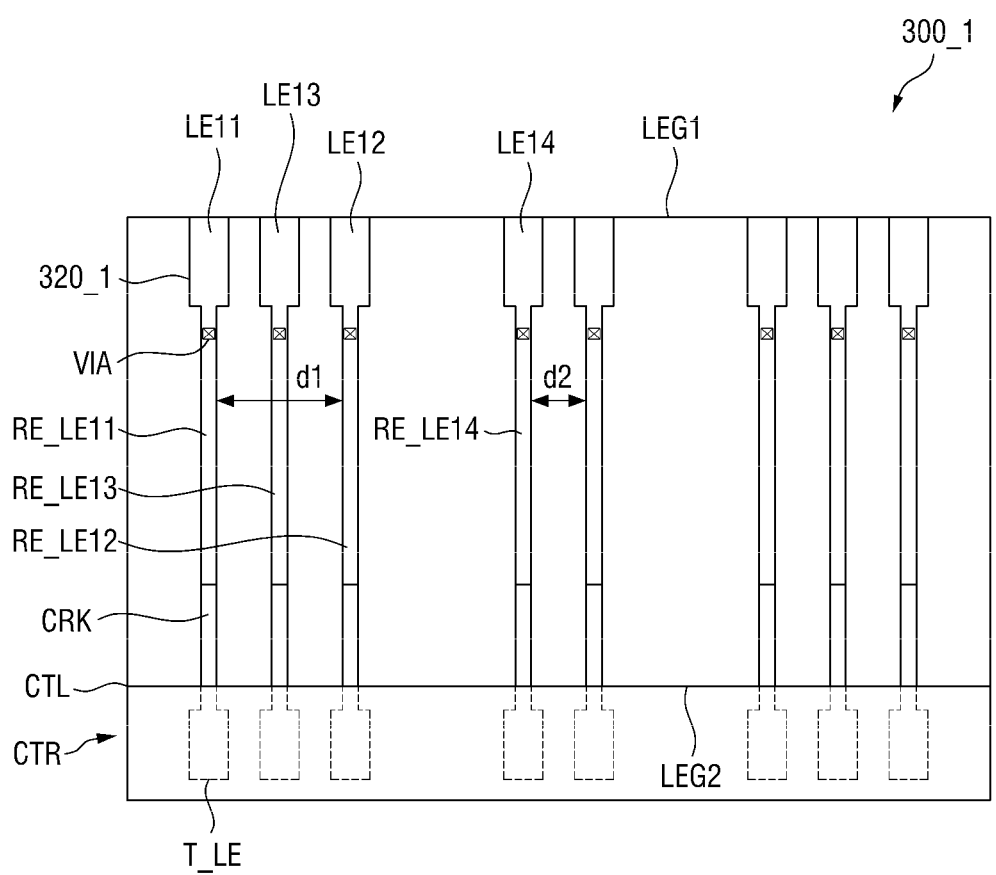
FIG. 13 is a plan layout view showing a first wiring layer of a first circuit board according to some example embodiments.
Figure 13:
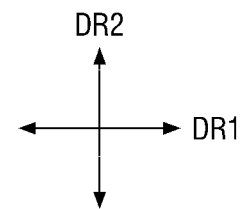

FIG. 11 is a cross-sectional view showing a case where a pressing device is located under first and second circuit boards to press a lower adhesive layer, FIG. 12 is a cross-sectional view of a display device according to some example embodiments, and FIG. 13 is a plan layout view showing a first wiring layer of a first circuit board according to some example embodiments.

Referring to FIGS. 11 to 13, a display device 2 according to the present embodiment is different from the aforementioned display device 1 in that a crack CRK is formed in the first protective organic layer 310_1 and first wiring layer 320_1 of the first circuit board 300_1 of the display device 2.

More specifically, that a crack CRK may be formed in the first protective organic layer 310_1 and first wiring layer 320_1 of the first circuit board 300_1 of the display device 2 according to the present embodiment.

As shown in FIG. 11, a pressing device 700 is located below the second circuit board 500. The pressing device 700 may serve to press the lower surface of the second circuit board 500 and to couple the first circuit board 300_1 and the panel lower sheet 200 through the intermodule coupling member AM.

As shown in FIG. 12, when the lower surface of the second circuit board 500 is pressed by the pressing device 700, the crack CRK may be formed in the first protective organic layer 310_1 and the first wiring layer 320_1.

As described above, the inner side surface of the intermodule coupling members AM may be recessed outwardly from the inner side surface of the first circuit board 300. In other words, the inner side surface of the first circuit board 300 may protrude inwardly from the inner side surface of the intermodule coupling member AM. Thus, the inwardly protruding portion of the first circuit board 300 with respect to the intermodule coupling member AM may be spaced apart from the overlaying panel lower sheet 200 with a space SP therebetween.

When the lower surface of the second circuit board 500 is pressed by the pressing device 700, the crack CRK may be formed in the first protective organic layer 310_1 and the first wiring layer 320_1 by the inwardly protruding portion of the first circuit board 300 with respect to the intermodule coupling member AM.

The crack CRK of the first protective organic layer 310_1 and the first wiring layer 320_1 may be formed around the inner side surface of the intermodule coupling member AM in a plan view.

As described above, the additive ions FSI may be eluted to the outside of the lower insulating layer 230 through external moisture in an environment of high temperature and high humidity, and the additive ions FSI eluted to the outside may cause the corrosion of the first wiring layer 320 of the adjacent first circuit board 300. When the crack CRK of the first protective organic layer 310_1 and the first wiring layer 320_1 is formed, the additive ions FSI may penetrate not only through the exposed inner side surface of the first wiring layer 320_1 of the first circuit board 300 but also through the surface of the first wiring layer 320_1 facing the panel lower sheet 200. Accordingly, the portions adjacent to the cutting line CTL of the plurality of residual lead wirings may be gradually corroded.

Further, as described above, when the high-potential signal is applied to the first residual lead wiring RE_LE11a and the low-potential signal is applied to the second residual lead wiring RE_LE12a, the first residual lead wiring RE_LE11a may have a potential of +V (V>0), and the second residual lead wiring RE_LE12a may have a potential of -V (V>0). In the first residual lead wiring RE_LE11a having undergone erosion, the constituent material (ion form) of the first residual lead wiring RE_LE11a may be eluted to the outside through peripheral moisture, and may move toward the adjacent residual lead wirings due to the additive ions FSI. For example, the constituent material (ionic form) of the first residual lead wiring RE_LE11a may move toward the second residual lead wiring RE_LE12a having a potential of -V (V>0). Thus, short and/or short circuit may occur between the first residual lead wiring RE_LE11a and the second residual lead wiring RE_LE12a, thereby causing wiring failure of the display device 1.

However, in the case of the present embodiment, the third residual wiring RE_LE13, which is a dummy lead wiring, is located between the first residual wiring RE_LE11 and the second residual wiring RE_LE12, thereby preventing the wiring failure of the display device 2 due to the occurrence of short and/or short circuit between the first residual wiring RE_LE11a and the second residual wiring RE_LE12a. That is, the third residual wiring RE_LE13 serves as a barrier for physically preventing the movement of the constituent material (ion form) of the first residual wiring RE_LE11a toward the second residual wiring RE_LE12a having a potential of -V (V>0), thereby preventing the wiring failure of the display device 2 due to the occurrence of short and/or short circuit between the first residual wiring RE_LE11a and the second residual wiring RE_LE12a.

Figure 14:
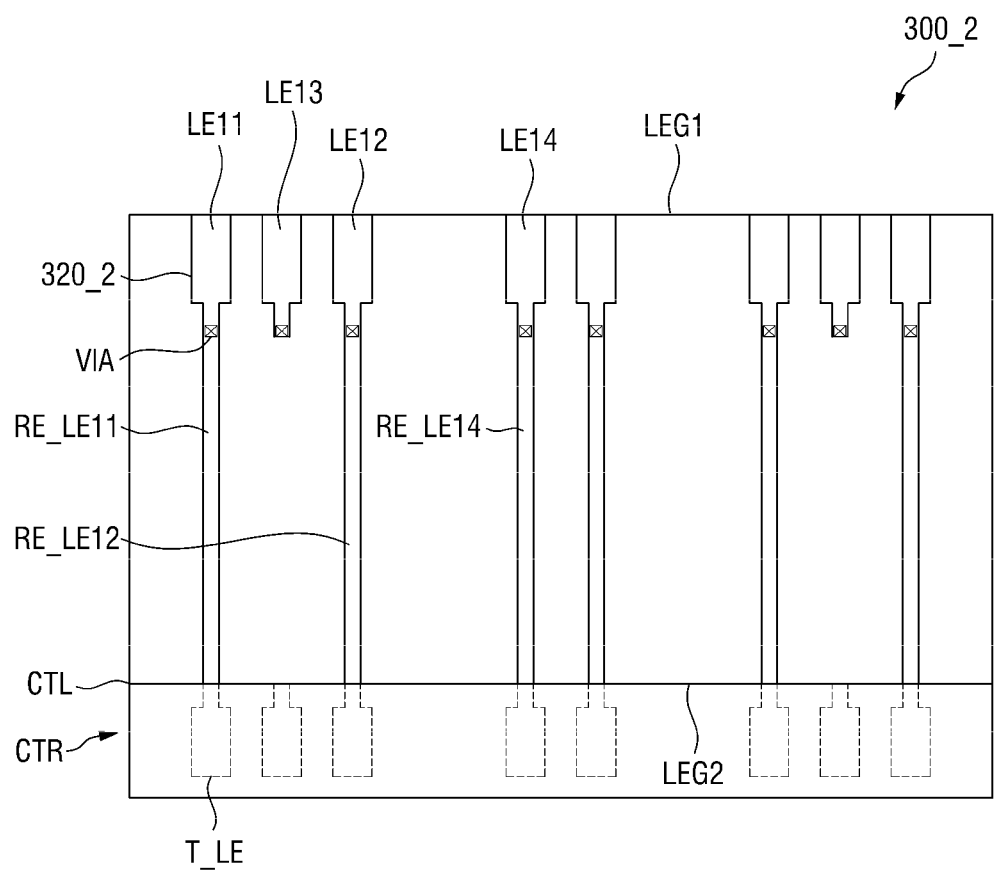
FIG. 14 is a plan layout view showing a first wiring layer of a first circuit board according to some example embodiments.
Figure 14:
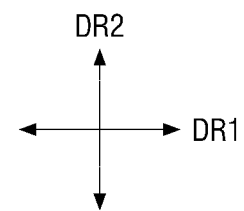

FIG. 14 is a plan layout view showing a first wiring layer of a first circuit board according to some example embodiments.

Referring to FIG. 14, a display device according to the present embodiment is different from the aforementioned display device 1 in that a first wiring layer 320_2 of a first circuit substrate 300_2 does not include a third residual lead wiring RE_LE13.

More specifically, in the display device according to the present embodiment, the first wiring layer 320_2 of the first circuit substrate 300_2 may not include the third residual lead wiring RE_LE13.

The first residual lead wiring RE_LE11, the second residual lead wiring RE_LE12, and the fourth residual lead wiring RE_LE14 may be electrically connected to the driving integrated circuit 390 as will be described later. The first residual lead wiring RE_LE11 and the second residual lead wiring RE_LE12 may receive gate potential signals from the driving integrated circuit 390, and the fourth residual lead wiring RE_LE14 may receive data signals from the data driving integrated circuit of the driving integrated circuit 390.

That is, the first residual lead wiring RE_LE11 may receive a high-potential gate signal, the second residual lead wiring RE_LE12 may receive a low-potential gate signal, and the potential difference between the high-potential gate signal and the low-potential gate signal may be greater than the potential difference between the data signals. Thus, the possibility of short circuit between the first residual lead wiring RE_LE11 and the second residual lead wiring RE_LE12 may be greater than the possibility of short circuit between the adjacent fourth residual lead wirings RE_LE14.

However, in the case of the present embodiment, the first distance d1 between the first residual lead wiring RE_LE11 and the second residual lead wiring RE_LE12 is greater than the second distance d2 between the adjacent residual fourth lead wirings RE_LE14, thereby decreasing the possibility of short circuit between the first residual lead wiring RE_LE11 and the second residual lead wiring RE_LE12.

Figure 15:
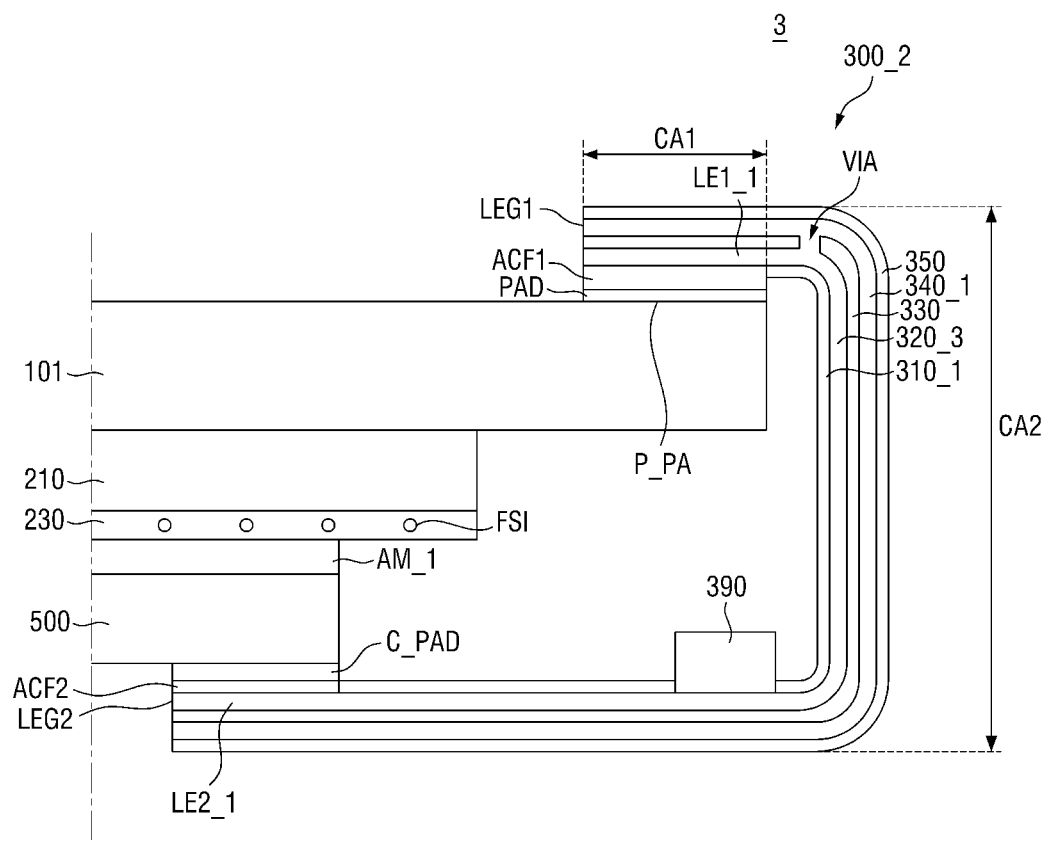
FIG. 15 is a cross-sectional view of a display device according to some example embodiments.
Figure 16:
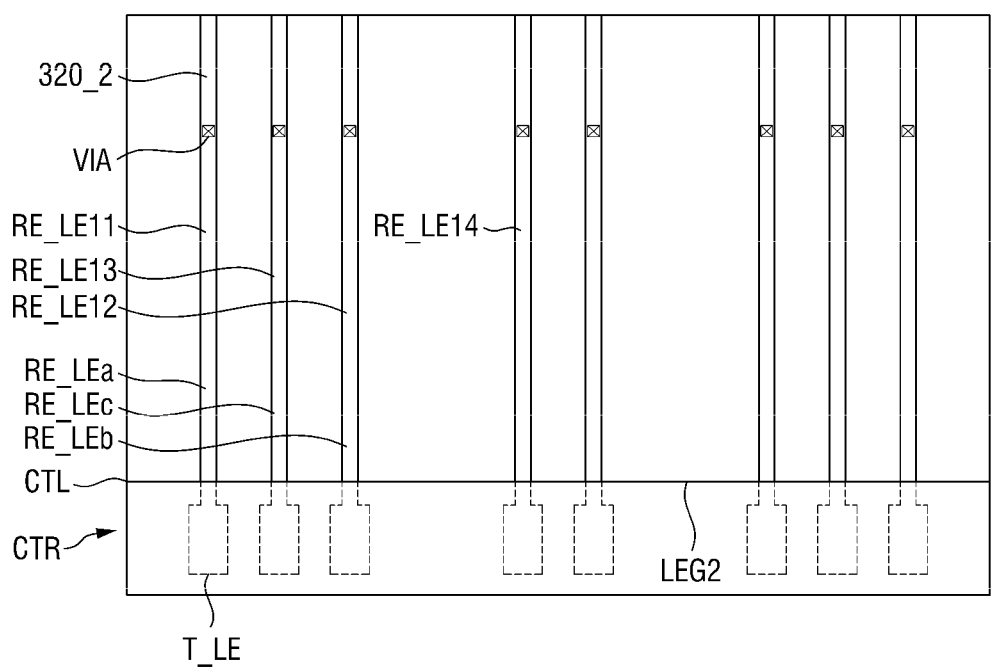
FIG. 16 is a plan layout view showing a first wiring layer of a first circuit board according to some example embodiments.
Figure 16:
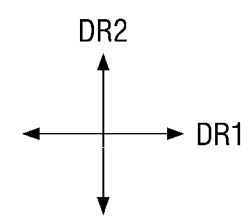
Figure 17:
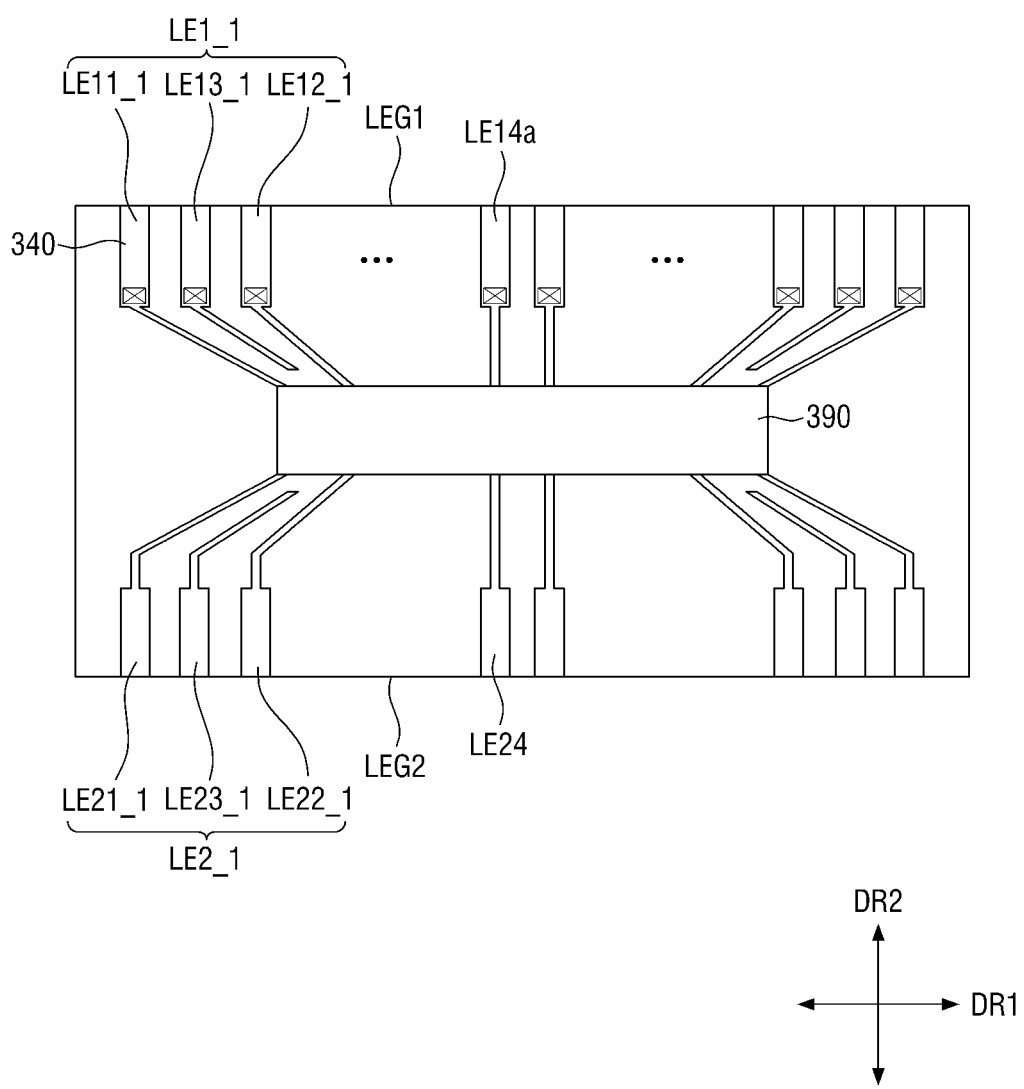
FIG. 17 is a plan layout view showing a second wiring layer of a first circuit board and a driving integrated circuit according to some example embodiments.

FIG. 15 is a cross-sectional view of a display device according to some example embodiments, FIG. 16 is a plan layout view showing a first wiring layer of a first circuit board according to some example embodiments, and FIG. 17 is a plan layout view showing a second wiring layer of a first circuit board and a driving integrated circuit according to some example embodiments.

Referring to FIGS. 15 to 17, a display device 3 according to the present embodiment is different from the aforementioned display device 1 in that a first wiring layer 320_3 is coupled with the circuit signal wring C_PAD of the second circuit board 500.

More specifically, the first protective organic layer 310_1 may be located in the second circuit area CA2. The first protective organic layer 310_1 may expose the first wiring layer 320_3 in the first circuit area CA1, and may expose the first wiring layer 320_3 in the third circuit area CA1. The exposed first wiring layer 320_3 may form a first lead wiring LE1_1 in the first circuit area CA1, and may form a second lead wiring LE2_1 in the third circuit area CA3. The first lead wiring LE1_1 may include a first sub-lead wiring LE11_1 coupled with the high-potential signal wiring PAD1, a second sub-lead wiring LE12_1 coupled with the low-potential signal wiring PAD2, a third sub-lead wiring LE14_1 coupled with the data signal wiring PAD4, and a first dummy lead wiring LE13_1 coupled with the panel dummy wiring PAD3.

The first wiring layer 320_3 exposed by the first protective organic layer, that is, the second lead wiring LE2_1, may be coupled with the circuit signal wring C_PAD located on the circuit pad area. A second conductive coupling member ACF2 may be located between the first wiring layer 320_3 and the circuit signal wiring C_PAD. That is, the first wiring layer 320_3 may be electrically connected to the circuit signal wiring C_PAD through the second conductive coupling member ACF2.

In some embodiments, the second lead wiring LE2_1 may be directly connected to the circuit signal wiring C_PAD without the second conductive coupling member ACF2. That is, the second lead wiring LE2_1 may be directly connected to the upper surface of the exposed circuit signal wiring C_PAD. For example, the second lead wiring LE2_1 may be ultrasonically bonded to the circuit signal wiring C_PAD.

The driving integrated circuit 390 may be located on the second circuit area CA2 of the first wiring layer 320_3.

The second wiring layer 340_1 may be in contact with the first wiring layer 320_3 through the via hole VIA of the lead insulating layer 330.

The second wiring layer 340_1 may include a plurality of residual lead wirings RE_LE11 to RE_LE14 electrically connected to the first wiring layer 320_3 through the via hole VIA.

As described above, the inner side surface of the first protective organic layer 310_1, the inner side surface of the first wiring layer 320_3, the inner side surface of the lead insulating layer 330, the inner side surface of the second wiring layer 340_1, and the inner side surface of the second protective organic layer 350, each of which includes the second long edge LEG2 of the first circuit board 300_2, may be exposed together.

Meanwhile, according to some example embodiments, a bracket for mounting the first circuit board 300_2, the second circuit board 500, the panel lower sheet 200, and the display panel 100 is located under the first circuit board 300_2 and the second circuit board 500, and thus the first circuit board 300_2, the second circuit board 500, the panel lower sheet 200, and the display panel 100 may be mounted by the bracket. However, the bracket may include insulating layers having an intermetallic insulation function, such as the lower insulating layer 230 of the panel lower sheet 200, and the insulating layers may further include additive ions such as fluorine ions ($F^-$) or sulfur ions ($S^{2-}$) having been described in the lower insulating layer 230. These additive ions may be eluted to the outside of the insulating layers of the bracket through external moisture in an environment of high temperature and high humidity. The additive ions eluted to the outside may cause the corrosion of residual lead wirings RE_LEa to RE_LEd of the second wiring layer 340_1 through the exposed inner side surface of the second wiring layer 340_1 of the adjacent first circuit board 300_2. Thus, short and/or short circuit may occur between the first residual lead wiring RE_LEa and the second residual lead wiring RE_LEb, thereby causing the wiring failure of the display device 3.

However, according to some example embodiments, the third residual wiring RE_LEc, which is a dummy lead wiring, is located between the first residual wiring RE_LEa and the second residual wiring RE_LEb, thereby preventing the wiring failure of the display device 3 due to the occurrence of short and/or short circuit between the first residual wiring RE_LEa and the second residual wiring RE_LEb.

As described above, according to some example embodiments of the present invention, a device capable of preventing the electrical short of a plurality of signal lines of a first wiring layer facing a display panel of a first circuit board can be provided.

The effects of the present invention are not limited by the foregoing, and other various effects are anticipated herein.

Although aspects of some example embodiments of the present invention have been disclosed for illustrative purposes, those skilled in the art will appreciate that various modifications, additions and substitutions are possible, without departing from the scope and spirit of the invention as disclosed in the accompanying claims and their equivalents.

What is claimed is:

1. A display device, comprising:
a display panel including a display area and a panel pad area around the display area;
a first circuit board, wherein a first end of the first circuit board is attached to the panel pad area; and
a second circuit board attached to a second end of the first circuit board,
wherein the panel pad area includes a plurality of panel signal wirings,
the second circuit board includes a plurality of circuit signal wirings,
the first circuit board includes a first wiring layer including a plurality of first lead wirings coupled to the plurality of panel signal wirings, an insulating layer on the first wiring layer and including a via hole, and a second wiring layer on the insulating layer and electrically connected to the first wiring layer through the via hole,
the plurality of first lead wirings includes a first sub-lead wiring, a second sub-lead wiring, and a first dummy lead wiring between the first sub-lead wiring and the second sub-lead wiring,
the first sub-lead wiring and the second sub-lead wiring are electrically connected to the plurality of circuit signal wirings, and
the first dummy lead wiring is electrically separated from the plurality of circuit signal wirings.

2. The display device of claim 1,
wherein the plurality of panel signal wirings are arranged over the display area and the panel pad area, and
the plurality of panel signal wirings include a first sub-signal wiring connected to the first sub-lead wiring, a second sub-signal wiring connected to the second sub-lead wiring, and a dummy signal wiring physically separated from the first dummy lead wiring.

3. The display device of claim 1,
wherein the second wiring layer includes a first connection wiring connected to the first lead wiring, and
the first connection wiring includes a first sub-connection wiring connected to the first sub-lead wiring, a second sub-connection wiring connected to the second sub-lead wiring, and a third sub-connection wiring connected to the first dummy lead wiring.

4. The display device of claim 3,
wherein the second wiring layer further includes a plurality of second lead wirings arranged between ends of the first connection wiring and the first circuit board and coupled to the circuit signal wiring, and
the plurality of second lead wirings includes a third sub-lead wiring connected to the first sub-connection wiring, a fourth sub-lead wiring connected to the second sub-connection wiring, and a second dummy lead wiring physically separated from the third sub-connection wiring.

5. The display device of claim 4,
wherein the first circuit board further includes a driving integrated circuit on the second wiring layer,
the first sub-connection wiring and the second sub-connection wiring are electrically connected to the driving integrated circuit, and the third sub-connection wiring is electrically separated from the driving integrated circuit.

6. The display device of claim 5, wherein the third sub-lead wiring and the fourth sub-lead wiring are electrically connected to the driving integrated circuit, and
the second dummy lead wiring is electrically separated from the driving integrated circuit.

7. The display device of claim 1, wherein the first sub-lead wring is a high-potential gate wiring (VGH), and the second sub-lead wiring is a low-potential gate wiring (VGL).

8. The display device of claim 1, wherein the first sub-lead wring is a high-potential voltage wiring (ELVDD), and the second sub-lead wiring is a low-potential voltage wiring (ELVSS).

9. The display device of claim 1, further comprising:
a panel lower sheet under the display panel, wherein the panel lower sheet includes a metal layer under the display panel and a lower insulating layer under the metal layer, and
the first circuit board is bent in a direction opposite to a display surface to be under the lower insulating layer.

10. The display device of claim 9, wherein the metal layer is an electrostatic blocking layer.

11. The display device of claim 9, wherein the lower insulating layer includes fluorine ions or sulfur ions.

12. The display device of claim 11, wherein the first circuit board further includes a first protective organic layer between the lower insulating layer and the first wiring layer and a second protective organic layer on the second wiring layer, and
the first protective organic layer partially exposes an upper surface of the first lead wiring.

13. The display device of claim 12, wherein inner side surfaces of the first protective organic layer, the insulating layer, the second wiring layer, and the second protective organic layer are arranged in a thickness direction, and inner side surfaces thereof are exposed.

14. The display device of claim 12, further comprising:
an intermodule coupling member between the first protective organic layer and the lower insulating layer to couple the panel lower sheet and the first circuit board.

15. The display device of claim 14, wherein an inner side surface of the first circuit board protrudes inwardly from an inner side surface of the intermodule coupling member.

16. The display device of claim 15, wherein the first wiring layer and/or the first protective organic layer includes a surface crack around the inner side surface of the intermodule coupling member in a plan view.

17. A display device, comprising:
a display panel including a display area and a panel pad area around the display area;
a first circuit board, one end of which is attached to the panel pad area; and
a second circuit board attached to the other end of the first circuit board,
wherein the panel pad area includes a plurality of panel signal wirings,
the second circuit board includes a plurality of circuit signal wirings,
the first circuit board includes a first wiring layer including a plurality of first lead wirings coupled to the plurality of panel signal wirings, an insulating layer on the first wiring layer and including a via hole, and a second wiring layer on the insulating layer and electrically connected to the first wiring layer through the via hole,
the plurality of first lead wirings includes a high-potential lead wiring, a low-potential lead wiring, and a dummy lead wiring between the high-potential lead wiring and the low-potential lead wiring,
the high-potential lead wiring is configured to receive a high-potential signal from the circuit signal wiring and to transmit the high-potential signal to the panel signal wiring,
the low-potential lead wiring is configured to receive a low-potential signal from the circuit signal wiring and to transmit the low-potential signal to the panel signal wiring,
the dummy lead wiring is electrically separated from the plurality of circuit signal wirings.

18. The display device of claim 17, wherein the high-potential lead wiring is a high-potential gate wiring (VGH), and the low-potential lead wiring is a low-potential gate wiring (VGL).

19. The display device of claim 17, wherein the high-potential lead wiring is a high-potential voltage wiring (ELVDD), and the high-potential lead wiring is a low-potential voltage wiring (ELVSS).

20. The display device of claim 17, further comprising:
a panel lower sheet under the display panel, wherein the panel lower sheet includes a metal layer under the display panel and a lower insulating layer under the metal layer, and
the first circuit board is bent in a direction opposite to a display surface to be under the lower insulating layer, and the lower insulating layer includes fluorine ions or sulfur ions.

* * * * *